United States Patent
Ji et al.

(10) Patent No.: US 11,526,049 B2
(45) Date of Patent: Dec. 13, 2022

(54) METHOD FOR MANUFACTURING STRUCTURAL COLOR FILTER BY ELECTRODEPOSITION OF METAL/DIELECTRIC LAYER/METAL

(71) Applicants: Ningbo Inlight Technology Co., Ltd., Ningbo (CN); The Regents of the University of Michigan, Ann Arbor, MI (US)

(72) Inventors: Chengang Ji, Ningbo (CN); Lingjie Jay Guo, Ann Arbor, MI (US); Saurabh Acharya, Ann Arbor, MI (US); Stephen Maldonado, Ann Arbor, MI (US)

(73) Assignees: NINGBO INLIGHT TECHNOLOGY CO., LTD., Ningbo (CN); THE REGENTS OF THE UNIVERSITY OF MICHIGAN, Ann Arbor, MI (US)

(*) Notice: Subject to any disclaimer, the term of this patent is extended or adjusted under 35 U.S.C. 154(b) by 227 days.

(21) Appl. No.: 16/883,727

(22) Filed: May 26, 2020

(65) Prior Publication Data
US 2020/0371395 A1  Nov. 26, 2020

Related U.S. Application Data

(60) Provisional application No. 62/852,488, filed on May 24, 2019.

(51) Int. Cl.
*G02F 1/1335* (2006.01)
*G02B 5/20* (2006.01)
(Continued)

(52) U.S. Cl.
CPC .......... *G02F 1/133516* (2013.01); *G02B 5/20* (2013.01); *H01L 27/14621* (2013.01); *H01L 27/3244* (2013.01)

(58) Field of Classification Search
None
See application file for complete search history.

(56) References Cited

U.S. PATENT DOCUMENTS

| | | |
|---|---|---|
| 6,031,653 A | 2/2000 | Wang |
| 2012/0268809 A1 | 10/2012 | Guo et al. |
| 2019/0107726 A1 | 4/2019 | Phillips et al. |

OTHER PUBLICATIONS

Han, Un-Bin, and Jang-Sik Lee. "Bottom-up synthesis of ordered metal/oxide/metal nanodots on substrates for nanoscale resistive switching memory." Scientific reports 6.1 (2016): 1-8. (Year: 2016).*

(Continued)

*Primary Examiner* — Michael Jung
(74) *Attorney, Agent, or Firm* — Crowell & Moring LLP

(57) ABSTRACT

A method of forming a structural color filter includes: depositing a first metal layer on a surface of a substrate by applying an electric potential to the substrate; depositing a first dielectric layer on the first metal layer by contacting the first metal layer with a second electrolyte; and depositing a second metal layer on the first dielectric layer. The surface of the substrate is in contact with a first electrolyte; the first electrolyte comprises a first precursor, an electrochemical reaction of the first precursor at the surface of the substrate is driven by the electric potential; the depositing the first metal layer on the surface of the substrate is performed at a temperature of less than or equal to 50° C. The second electrolyte comprises a second precursor of a first dielectric material of the first dielectric layer.

20 Claims, 9 Drawing Sheets

(51) Int. Cl.
*H01L 27/146* (2006.01)
*H01L 27/32* (2006.01)

(56) References Cited

OTHER PUBLICATIONS

Brandt, Iuri S., et al. "Electrical characterization of Cu/Cu2O electrodeposited contacts." ECS Transactions 14.1 (2008): 413. (Year: 2008).*
Chinese First Office Action, Chinese Application No. 202010443195.2, dated Dec. 16, 2021 (16 pages).
European Search Report, European Application No. 20176193.9, dated Aug. 10, 2020, 10 pages.
Chinese Second Office Action with English Translation, dated Jul. 29, 2022, pp. 1-16, Issued in Chinese Application No. 202010443195.2., The State Intellectual Property Office of People's Republic of China.

* cited by examiner (a)

(b)

(c)

METHOD FOR MANUFACTURING STRUCTURAL COLOR FILTER BY ELECTRODEPOSITION OF METAL/DIELECTRIC LAYER/METAL

CROSS-REFERENCE TO RELATED APPLICATIONS

This application claims a priority to an U.S. Patent Application No. 62/852,488, filed on May 24, 2019, the content of which is herein incorporated by reference in its entirety.

GOVERNMENT SUPPORT

This invention was made with government support under CHE1505635 awarded by the National Science Foundation. The government has certain rights in the invention.

TECHNICAL FIELD

The present disclosure relates to structural color filter devices, and in particular to a method of forming a structural color filter device via liquid solution deposition.

BACKGROUND

A color filter is an important component in various display devices, including flat panel displays, liquid crystal displays, projection displays, eyewear displays, light emitting diodes (LEDs), complementary metal-oxide-semiconductor (CMOS) image sensors, and the like. For example, transmission-type structural color filters are widely utilized in applications such as liquid crystal display (LCD) panels. Conventional optical filters use pigment dispersions to produce red-green-blue (RGB) colors by absorbing complementary colors. However, chemical pigments are vulnerable to attack from a variety of chemicals, cannot withstand constant illumination with strong light intensities, and require extensive multilayer processing to pattern individual pixels.

The structural color filter that selectively transmits or reflects visible light is an attractive replacement for colorant pigmentation in current display technologies. Structural colors based on optical interference effects of nanostructures, including plasmonic or photonic crystals, have received increasing interest due to their advantages over traditional colorant-based pigmentations. Such advantages include high brightness, ultra-compactness, easy manufacturability, low power consumption, slim dimensions, and enhanced resolution, and robust long-term stability, among others.

Color generation via plasmonic or guide-mode resonance structures typically involve sub-wavelength patterns that require complicated and time-intensive fabrication techniques, such as e-beam lithography and focused ion beam milling, which significantly limit their large-scale feasibility. Three-dimensional (3D) photonic crystals (PC) employing self-assembled nanoparticles are also a potential candidate for generating distinct structural colors. However, substrates of high flatness and smoothness are required for self-assembled processes to obtain continuous and uniform coating, which limits their use for many applications. A large portion of the cost of forming structural color based filter devices is related to the need to use expensive ancillary vacuum systems at high temperatures to form high quality thin films. Thus, it would be desirable to find a simple and inexpensive process to fabricate high quality structural color devices at ambient conditions.

SUMMARY OF THE DISCLOSURE

According to a first aspect of the present disclosure, a method of forming a structural color filter is provided. The method includes: depositing a first metal layer on a surface of a substrate by applying an electric potential to the substrate; depositing a first dielectric layer on the first metal layer by contacting the first metal layer with a second electrolyte; and depositing a second metal layer on the first dielectric layer. The surface of the substrate is in contact with a first electrolyte; the first electrolyte includes a first precursor, an electrochemical reaction of the first precursor at the surface of the substrate is driven by the electric potential. The depositing the first metal layer on the surface of the substrate is performed at a temperature of less than or equal to 50° C. The second electrolyte includes a second precursor of a first dielectric material of the first dielectric layer, and the first metal layer is sandwiched between the first dielectric layer and the substrate. The first dielectric layer is sandwiched between the first metal layer and the second metal layer.

According to a second aspect of the present disclosure, a method of forming a structural color filter is provided. The method includes: depositing a first metal layer on a surface of a substrate in contact with a first electrolyte by applying an electric potential to the substrate; depositing a dielectric layer on the first metal layer by contacting the first metal layer with a second electrolyte; and depositing a second metal layer on the dielectric layer by contacting the dielectric layer with a third electrolyte and applying an electric potential to the substrate. The first electrolyte includes a first precursor and has a pH of less than or equal to 3, the electric potential drives an electrochemical reaction of the first precursor at the surface of the substrate, the depositing the first metal layer on the surface of the substrate is performed at a temperature of less than or equal to 50° C., and the first metal layer film includes a metal selected from the group consisting of: gold (Au), copper (Cu), aluminum (Al), silver (Ag), and combinations thereof. The second electrolyte includes a second precursor of a dielectric material of the dielectric layer and has a pH of greater than or equal to 10. The third electrolyte includes a third precursor and has a pH of greater than or equal to 10, the electric potential drives an electrochemical reaction of the third precursor at a surface of the dielectric layer, the depositing the second metal layer on the dielectric layer is performed at a temperature of less than or equal to 50° C., and the second metal layer includes a metal selected from the group consisting of: gold (Au), copper (Cu), aluminum (Al), silver (Ag), and combinations thereof.

According to a third aspect of the present disclosure, a method of forming a structural color filter is provided. The method includes: depositing a first metal layer on a surface of a substrate by a first electrodeposition process, wherein the first electrodeposition process is performed at a temperature of less than or equal to 50° C.; depositing a first dielectric layer on the first metal layer by a second electrodeposition process, wherein the first metal layer is sandwiched between the first dielectric layer and the substrate; and depositing a second metal layer on the first dielectric layer, wherein the first dielectric layer is sandwiched between the first metal layer and the second metal layer.

BRIEF DESCRIPTION OF THE DRAWINGS

The drawings described herein are for illustrative purposes only of selected embodiments and not all possible implementations, and are not intended to limit the scope of the present disclosure.

A same reference number used in various embodiments may indicate a same element.

DETAILED DESCRIPTION

Figure 1:
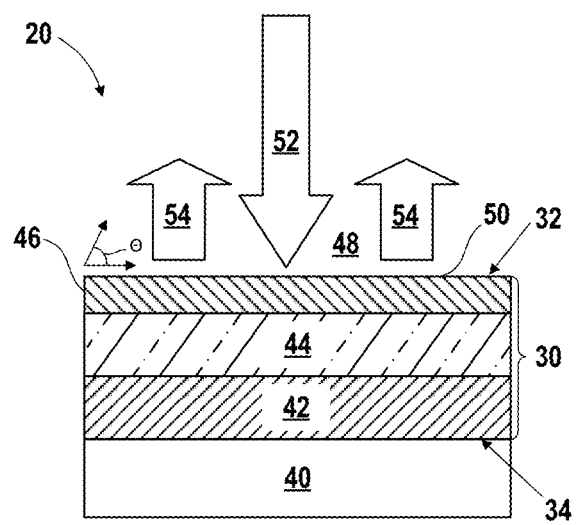
FIG. 1 is a schematic view of an asymmetric reflective-type structural color-filtering device based on an interference type filter assembly according to an embodiment of the present disclosure.

Embodiments are provided so that this disclosure will be thorough and will fully convey the scope to those who are skilled in the art. Details are provided in examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some embodiments, well-known processes, well-known device structures, and well-known technologies are not described in detail.

The terminology used herein is for the purpose of describing particular embodiments only and is not intended to limit the scope of the present disclosure. As used herein, singular forms "a," "an," and "the" may be intended to include plural forms as well, unless the context clearly indicates otherwise. Terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the inclusive term "comprising" is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method step, process, and operation described herein are not required to be performed in a particular order discussed or illustrated, unless specifically identified as an order of performance. It is also to be understood that additional or alternative operations may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

As used herein, unless otherwise indicated, amounts expressed in weight and mass are used interchangeably, but should be understood to reflect a mass of a given component.

As used herein, the terms "composition" and "material" are used interchangeably to refer broadly to a substance containing at least the preferred chemical compound(s), but which may also comprise additional substances or compounds, including impurities.

Example embodiments will now be described more fully with reference to the accompanying drawings. According to a first aspect of the present disclosure, a method of forming a structural color filter is provided. The method includes: depositing a first metal layer on a surface of a substrate by applying an electric potential to the substrate; depositing a first dielectric layer on the first metal layer by contacting the first metal layer with a second electrolyte; and depositing a second metal layer on the first dielectric layer. The surface of the substrate is in contact with a first electrolyte; the first electrolyte includes a first precursor, an electrochemical reaction of the first precursor at the surface of the substrate is driven by the electric potential. The depositing the first metal layer on the surface of the substrate is performed at a temperature of less than or equal to 50° C. The second electrolyte includes a second precursor of a first dielectric material of the first dielectric layer, and the first metal layer is sandwiched between the first dielectric layer and the substrate. The first dielectric layer is sandwiched between the first metal layer and the second metal layer.

In some embodiments, the method further includes depositing a second dielectric layer on the second metal layer. The second metal layer is sandwiched between the first dielectric layer and the second dielectric layer.

In some embodiments, the first metal layer includes a metal selected from the group consisting of: gold (Au), copper (Cu), aluminum (Al), silver (Ag), and combinations thereof.

In some embodiments, each of the depositing the first metal layer on the surface of the substrate, the depositing the first dielectric layer on the first metal layer, and the depositing the second metal layer on the first dielectric layer is performed in an environment having an ambient pressure.

In some embodiments, the depositing the second metal layer on the first dielectric layer includes contacting the first dielectric layer with a third electrolyte. The third electrolyte comprises a third precursor, and the third electrolyte is basic having a pH of greater than or equal to 10.

In some embodiments, the depositing the second metal layer on the first dielectric layer includes depositing the second metal layer by an electroless deposition process.

In some embodiments, the second metal layer includes silver, and the electroless deposition process includes exposing a surface of the first dielectric layer to a silver precursor solution and a silver activator solution, exposing the surface of the first dielectric layer to a sensitizing solution, and exposing the surface of the first dielectric layer to a reducer solution.

In some embodiments, the method further includes: forming a second dielectric layer on the second metal layer, and forming a third metal layer on the second dielectric layer. The first metal layer and the third metal layer have a same first thickness, the second metal layer, the first dielectric layer, and the second dielectric layer have a same second thickness, and the first thickness and the second thickness are different.

In some embodiments, the method further includes: forming a third dielectric layer adjacent to the first metal layer, wherein the third dielectric layer has a first exposed surface; and forming a fourth dielectric layer adjacent to the third metal layer, wherein the fourth dielectric layer has a second exposed surface. The third dielectric layer and the first dielectric layer are formed on two opposing sides of the first metal layer, and the fourth dielectric layer and the second dielectric layer are formed on two opposing sides of the third metal layer.

In some embodiments, the first metal layer, the first dielectric layer, the second metal layer, the second dielectric layer, and the third metal layer forms a stack, and the method further includes separating the stack from the substrate and grinding the stack into particles.

In some embodiments, the first precursor includes a metal selected from the group consisting of: gold (Au), copper (Cu), aluminum (Al), silver (Ag), and combinations thereof, and the first precursor is selected from the group consisting of: chloroauric acid, potassium dicyanoaurate, copper citrate, copper tartrate, copper glycerol, silver cyanide, aluminum chloride, silver nitrate, silver diammine complex and combinations thereof.

In some embodiments, a material of the first dielectric layer is selected from the group consisting of: cuprous oxide ($Cu_2O$), amorphous silicon (a-Si), titanium oxide (TiOx), zinc oxide (ZnO), and combinations thereof, and the second precursor is selected from the group consisting of: copper sulfate, trichlorosilane, zinc nitrate, and titanium powder.

In some embodiments, the depositing the first metal layer includes applying a current at a current density of greater than or equal to 0.05 $mA/cm^2$ and less than or equal to 1 $mA/cm^2$.

In some embodiments, the depositing the first dielectric layer includes applying a current at a current density of greater than or equal to 0.05 $mA/cm^2$ and less than or equal to t 0.1 $mA/cm^2$.

In some embodiments, the depositing the first dielectric material layer and the depositing of the first metal layer are performed in a three-electrode cell comprising a reference electrode, and the method further includes monitoring one or more parameters selected from the group consisting of: nucleation of material, material thickness, and rate of deposition of material, via the reference electrode.

In some embodiments, the first metal layer has a surface roughness of less than or equal to 25% of a thickness of the first metal layer.

In some embodiments, the working electrode includes an electrically conductive substrate, and the electrically conductive substrate is transparent to visible light and flexible.

In some embodiments, the first metal layer has a first thickness of greater than or equal to 5 nm and less than or equal to 50 nm, the second metal layer has a second thickness of greater than or equal to 5 nm and less than or equal to 50 nm, and the second thickness is greater than or equal to the first thickness.

According to a second aspect of the present disclosure, a method of forming a structural color filter is provided. The method includes: depositing a first metal layer on a surface of a substrate in contact with a first electrolyte by applying an electric potential to the substrate; depositing a dielectric layer on the first metal layer by contacting the first metal layer with a second electrolyte; and depositing a second metal layer on the dielectric layer by contacting the dielectric layer with a third electrolyte and applying an electric potential to the substrate. The first electrolyte includes a first precursor and has a pH of less than or equal to 3, the electric potential drives an electrochemical reaction of the first precursor at the surface of the substrate, the depositing the first metal layer on the surface of the substrate is performed at a temperature of less than or equal to about 50° C., and the first metal layer film includes a metal selected from the group consisting of: gold (Au), copper (Cu), aluminum (Al), silver (Ag), and combinations thereof. The second electrolyte includes a second precursor of a dielectric material of the dielectric layer and has a pH of greater than or equal to 10. The third electrolyte includes a third precursor and has a pH of greater than or equal to 10, the electric potential drives an electrochemical reaction of the third precursor at a surface of the dielectric layer, the depositing the second metal layer on the dielectric layer is performed at a temperature of less than or equal to 50° C., and the second metal layer includes a metal selected from the group consisting of: gold (Au), copper (Cu), aluminum (Al), silver (Ag), and combinations thereof.

According to a third aspect of the present disclosure, a method of forming a structural color filter is provided. The method includes: depositing a first metal layer on a surface of a substrate by a first electrodeposition process, wherein the first electrodeposition process is performed at a temperature of less than or equal to 50° C.; depositing a first dielectric layer on the first metal layer by a second electrodeposition process, wherein the first metal layer is sandwiched between the first dielectric layer and the substrate; and depositing a second metal layer on the first dielectric layer, wherein the first dielectric layer is sandwiched between the first metal layer and the second metal layer.

The present disclosure provides a method of fabricating structural color filter devices via simple and inexpensive liquid solution processing (e.g., by electrodeposition) at ambient conditions, thereby avoiding need for expensive vacuum based systems conventionally used to deposit multilayered structural colors. Generally, the process involves electrolytic deposition or electrodeposition of a material from a liquid solution of precursor in the presence of an electrical current or potential to form at least one metal layer of the structural color filter. In certain aspects, all of the layers of the structural color filter may be formed via electrodeposition processes. In alternative variations, one or more layers may be formed via other processing techniques. For example, one or more layers may be formed via a liquid solution-based electroless plating process, which refers to a chemically applied metal material coating. The deposition of the metal is accomplished via an autocatalytic reaction, rather than by presence of an electrical current or potential. In certain aspects, the present disclosure provides use of electrodeposition processes to achieve all-solution processed structural color devices.

Electrodeposition and in alternative variations, electroless plating, are advantageous processes to deposit uniform metal and dielectric thin-films at ambient conditions. They both have the unique ability to achieve conformal deposition of metal layers regardless of microroughness or curvature of the substrates on which they are deposited. Electrodepositions performed with a three-electrode cell in accordance with certain aspects of the present disclosure possess the added advantage of having the ability to observe and control the nucleation, deposition rate, thickness, and the like of the electrodeposited thin-films in real-time.

This method provides advantages over traditional deposition or assembly techniques in terms of feasibility to directly deposit structural color filters and to decorate surfaces of any size, shape, roughness, and the like at low cost, thus potentially leading to more extensive use of structural colors in a variety of applications.

By way of background, a structural color filter device may include a multilayered device, which may include at least a first metal layer, a second metal layer, and a dielectric material disposed therebetween. Such a structural color may be a metal-dielectric-metal resonator structure that can filter electromagnetic energy (e.g., visible light) for both transmission and reflection types. By tuning the dielectric layer thickness, the transmission or reflection peak of the device can be tuned to cover a range of predetermined wavelengths. In certain aspects, different color pixels can be fabricated by the methods provided by the present disclosure.

In certain aspects, an optical spectrum or structural color filter device formed in accordance with the techniques described in the present disclosure may comprise an interference filter assembly. Spectrum filtering, such as color filtering, can be achieved based on optical interference effect, rather than optical absorption by colorant materials. In certain aspects, the present teachings provide a structural color filter device comprising an interference filter assembly that generates a filtered electromagnetic energy output having minimal angle dependence. By way of non-limiting example, such interference filter devices can be based on Fabry-Pérot etalon devices that filter light, while further having a high refractive index dielectric layer included in the filter device that minimizes angle dependence of the filtered light generated by the device.

The interference filter assembly may thus include a dielectric material having a relatively high refractive index, for example, of greater than about 1.5 disposed between a pair of parallel reflective surfaces. The refractive index refers to the real part (n) of n+ik, wherein and k are the real and imaginary parts of the refractive index, respectively. Each reflective surface optionally comprises a metal (e.g., the first metal layer or the second metal layer). The filter assembly is capable of transmitting a portion of an electromagnetic spectrum to generate a filtered output having a predetermined range of wavelengths that desirably displays minimal angle dependence. In certain aspects, a structural color device displays minimal angle dependence when such a predetermined range of wavelengths varies less than or equal to about 50 nm from an incidence angle of 0 to an incidence angle of 60° with respect to the exposed surface of the device.

In certain aspects, the filter assembly is capable of transmitting a portion of an electromagnetic spectrum into the dielectric material to generate a filtered output having a predetermined range of wavelengths that exits the structural color filter assembly. Any non-transmitted light is mainly reflected, while a small portion of light may be absorbed by metal. The filtered output desirably displays minimal angle dependence, making it particularly advantageous for use as pixels in display devices, by way of non-limiting example. The spectrum or color filter can be designed to be polarization independent. Such a structural color device filter is more energy efficient than traditional colorant based filters and furthermore can withstand high input optical power.

Both transmission and reflection color filtering can be achieved by structural color filter devices prepared in accordance with the methods of the present disclosure. In certain variations, the structural color filter device may be a transmission-type filter, while in other variations; the structural color filtering device may be a reflection-type filter. In yet other variations, the structural color filtering device concurrently exhibits both a transmission-type and reflection-type filter.

Referring to FIG. 1, a structural color filtering device 20 is shown and includes a filter assembly 30. The filter assembly 30 may have a first side 32 and a second side 34 opposing to the first side 32. The filter assembly 30 may be disposed on a substrate 40, and the substrate 40 may be a transmissive layer. The filter assembly 30 may include a first reflective layer 42 disposed adjacent to the transmissive substrate 40. The first reflective layer 42 may be a metal layer. The filter assembly 30 may also include at least one dielectric material layer 44 adjacent to the first reflective layer 42. A second reflective layer 46 may be disposed adjacent to dielectric material layer 44 on a side opposite to the first reflective layer 42. The second reflective layer 46 may be a metal layer. Together, the first reflective layer 42 and the second reflective layer 46 may form a pair of parallel reflective layers that sandwich the dielectric material layer 44. The filter assembly 30 has an "asymmetric structure," where a thickness of the first reflective layer 42 may be different from that of the second reflective layer 46 disposed opposite to the dielectric material layer 44. The second reflective layer 46 interfaces with air 48 or another external medium.

In FIG. 1, the second reflective layer 46 may define a visible surface 50 along the first side 32. A source 52 of electromagnetic radiation may be directed towards the filter assembly 30 of the structural color filtering device 20 reaching the first side 32. The filter assembly 30 may be capable of transmitting a portion of a spectrum of electromagnetic radiation from source 52 into the assembly 30. Thus, a portion of electromagnetic radiation passes through the second reflective layer 46 to enter the dielectric material layer 44. The path of the electromagnetic radiation inside a interference filter depends upon whether the structural color filtering device 20 is designed to be a transmission-type filter, a reflection-type filter, or a transmission and reflection-type filter. In one embodiment, a reflection-type Fabry-Pérot based filter may be arranged, the portion of electromagnetic radiation that enters the dielectric material layer 44 resonates between a pair of parallel reflective surfaces (like a Fabry-Pérot based etalon interference filter). In one embodiment, a surface of the first reflective layer 42 close to the dielectric material layer 44 and a surface of the second reflective layer 46 close to the dielectric material layer 44 may be the pair of parallel reflective surfaces. A portion of the electromagnetic radiation may be reflected by the surface of the first reflective layer 42 generating a reflected/filtered output 54 having a predetermined range of wavelengths, and the reflected/filtered output 54 may exit the filter assembly 30.

A general operational principle of the Fabry-Pérot based structural color filter may be described in U.S. Pat. No. 9,261,753 by Guo et al., the relevant portions of which are incorporated herein by reference. The method provided by the present disclosure may include providing a filter having reduced angle dependence. That is, as a viewing angle (Θ) may deviate from being normal (0°) to being parallel to a visible surface (nearing 90°), a wavelength of filtered light is not considerably shifted. The viewing angle (Θ) may refer to an angle between a direction from which a user views the visible surface and a direction perpendicular to the visible surface. Angle dependency is a frequent problematic issue with conventional color filters used in display devices, even in conventional Fabry-Pérot (F-P) based filters. However, a shift of the transmission wavelength for increasing an incident angle (Θ) is reduced by using a high refractive index dielectric medium in the assemblies prepared in the present disclosure. By including specific dielectric materials having relatively high refractive indices, the angle dependency of the filter device can be significantly reduced/minimized. The high refractive index materials described herein may include traditional dielectric materials, but may also include optical metamaterials, liquid crystals, and other highindex materials described below. This principle applies to both transmission and reflection spectrum filters, like color filters.

According to the present disclosure, the structural color filtering device may include an interference filter assembly. The interference filter assembly may include a dielectric material layer disposed between a pair of parallel reflective surfaces. The dielectric material layer may have a relatively high refractive index, for example, greater than about 1.4. In some embodiments, the dielectric material layer may have a relatively high refractive index greater than about 1.5, greater than or equal to 1.6, greater than or equal to 1.7; greater than or equal to 1.8; greater than or equal to 1.9; greater than or equal to 2.0; greater than or equal to 2.2; greater than or equal to 2.5; greater than or equal to 3; greater than or equal to 3.5; greater than or equal to 4; and in some embodiments, relatively high refractive index of the dielectric material layer may be greater than or equal to 5. The refractive index of the dielectric materials used for forming the dielectric material layer in the structural color filtering device may not be limited by the present disclosure. For example, cuprous oxide ($Cu_2O$) having a refractive index of 2.6 may be used, zinc oxide (ZnO) having a refractive index of about 2.0 may be used, zirconium oxide ($ZrO_2$) having a refractive index of about 2.2 may be used, and titanium oxide ($TiO_2$) having a refractive index of about 2.2 may be used. The material having such a high refractive index may be used individually. Alternatively, various materials having various refractive indices may be used cooperatively.

In some embodiments, the dielectric layer may include a single layer, while in some embodiments; the dielectric layer may include a plurality of distinct layers having different compositions. As noted above, a thickness of the dielectric layer (including the single layer or the plurality of distinct layers) is sub-wavelength for the wavelengths of the target spectrum and in combination with other variables well known to those of skill in the art, determines the wavelength of light filtered from a Fabry-Perot-based optical interference filter. The thickness of the dielectric layer is related to the wavelength of the filtered output that is generated. In some embodiments, depending on the material used for forming the dielectric layer, the thickness of the dielectric layer may range from greater than or equal to 5 nm to less than or equal to 200 nm, alternatively from greater than or equal to 10 nm to less than or equal to 100 nm, alternatively from greater than or equal to 15 nm to less than or equal to 75 nm, alternatively from greater than or equal to 20 nm to less than or equal to 70 nm. In one embodiment, a thickness of the dielectric layer having cuprous oxide ($Cu_2O$) may be about 20 nm to generate a yellow colored output. Alternatively, the thickness of the dielectric layer having cuprous oxide ($Cu_2O$) may be about 45 nm to generate a magenta colored output. Alternatively, the thickness of the dielectric layer having cuprous oxide ($Cu_2O$) may be about 70 nm to generate a cyan colored output. An output in other colors, such as red, green, and blue colors, may be generated by slightly tuning the thickness of the dielectric layer or modifying structural configuration of the dielectric layer.

As described above, the dielectric layer may be disposed between the pair of parallel reflective surfaces of the first and the second reflective layers. In some embodiments, each reflective layer may include a reflective material, such as gold (Au), copper (Cu), aluminum (Al), silver (Ag), and combinations thereof, which will not be limited by the present disclosure. The filter assembly may be capable of transmitting a portion of the source 52 into the dielectric layer 44 and generate a filtered output 54 having a predetermined range of wavelengths that exits the filter assembly 30. The filtered output may have a predetermined range of wavelengths and may have a minimal angle dependence.

A thickness of a first metal layer (e.g., first reflective surface 42 in FIG. 1) disposed adjacent to the transmissive layer (e.g., transmissive substrate 40) may be in a range from 40 nm (40 nm inclusive) to 60 nm (60 nm inclusive). In some embodiments, the thickness of the first metal layer disposed adjacent to the transmissive layer may be about 40 nm, about 50 nm, or about 60 nm.

A thickness of a second metal layer (e.g., second reflective surface 46 in FIG. 1) disposed adjacent to the dielectric layer (e.g., dielectric layer 44) may be less than or equal to 50 nm. In some embodiments, the thickness of the second metal layer may be in a range from 5 nm (5 nm inclusive) to 50 nm (50 nm inclusive), alternatively in a range from 5 nm (5 nm inclusive) to 20 nm (20 nm inclusive), alternatively in a range from 5 nm (5 nm inclusive) to 15 nm (15 nm inclusive). In some embodiments, the second metal layer may be thus thinner than the first metal layer and thin enough to facilitate transmission of the portion of the electromagnetic radiation (e.g., the source 52 in FIG. 1).

In some embodiments, any material being highly transmissive to visible light may be selected by those of skill in the art to produce the substrate 40. In other embodiments, as described below, the substrate 40 may be removed from the filter assembly 30. In some embodiments, the substrate 40 may not be electrically conductive.

For examples of the substrate may be a glass based or polymeric substrate. In some embodiments, the substrate may is flexible. For example, the polymeric substrate may include polyesters, such as polyethylene terephthalate (PET), polyethylene naphthalate or (poly(ethylene 2,6-naphthalate) (PEN), polycarbonates, polyacrylates and polymethacrylates, including poly(methylmethacrylate) (PMMA), poly(methacrylate), poly(ethylacrylate), siloxanes, like polydimethylsiloxane (PDMS), and the like. In other embodiments, the substrate may include silicon dioxide, silicon, for example, crystalline silicon (Si), and the like, which will not be limited by the present disclosure. In some embodiments, the substrate may not be electrically conductive, but may have an electrically conductive coating disposed thereon such that the coated substrate may serve as a working electrode during the electrolytic deposition processes described herein. The working electrode may be a substrate transparent to visible light. In other embodiments, the working electrode may be a rigid or flexible substrate that is electrically conductive or coated with an electrically conductive coating (e.g., a conductive seed layer).

Particularly suitable visible and infrared electromagnetic radiation includes visible light having wavelengths ranging from about 390 to about 750 nm and infrared radiation (IR) (including near infrared (NIR) ranging from about 0.75 to about 1.4 μm). Filtered electromagnetic radiation may have a wavelength in a range of about 625 nm to 740 nm for red; a wavelength in a range of about 590 nm to about 625 nm for orange; a wavelength in a range of about 565 nm to about 590 nm for yellow; a wavelength in a range of about 520 nm to about 565 nm for green; a wavelength in a range of 500 nm to about 520 nm for blue or cyan; a wavelength in a range of about 435 nm to about 500 nm for blue and indigo; and a wavelength in a range of about 380 nm to about 435 nm for violet. Further, in some embodiments, the filtered light may be extra-spectral or a mixture of several different wavelengths. For example, a wavelength of magenta may be an extra-spectral mixture of red (625 nm to 740 nm) and blue (435 nm to 500 nm).

In some embodiments, the structural color filtering device may be a reflection-type filter, so that the filter assembly may be capable of transmitting the portion of the electromagnetic radiation through one of the pair of parallel reflective surfaces into the dielectric layer to the other of the pair of parallel reflective surfaces. However, a portion of the electromagnetic radiation that enters a first side (e.g., first side 32) of the filter assembly may be reflected within the filter assembly 30 and may exit the filter assembly 30 through the first side (e.g., first side 32). When the structural color filter device is a reflection-type filter that generates a filtered output that exits the filter assembly, as shown in FIG. 1, a predetermined range of reflected wavelengths may include a color selected from the group consisting of: red, green, blue, cyan, magenta, yellow, and combinations thereof.

Figure 2:
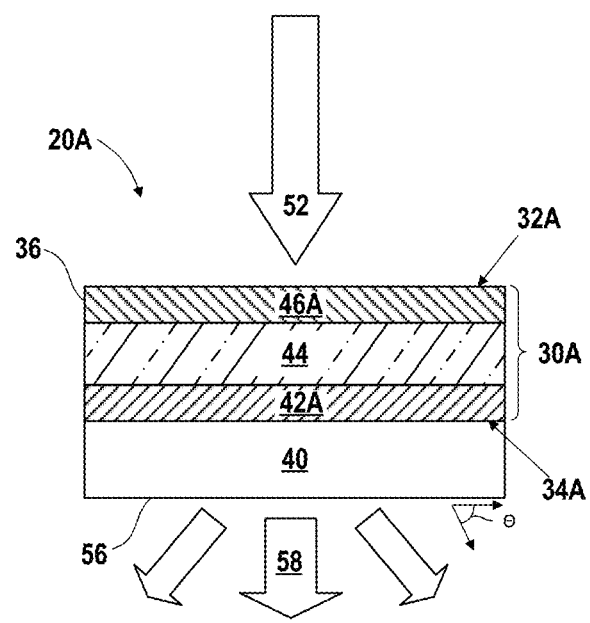
FIG. 2 is a schematic view of a symmetric transmissive-type structural color-filtering device based on an interference type filter assembly according to an embodiment of the present disclosure.

In some embodiments, as shown in FIG. 2, a structural color device or an optical spectrum filtering device 20A having a transmission-type filter may be provided. To the extent that the components are the same in the structural color filtering device 20 shown in FIG. 1, for brevity, they will not be repeated herein. A filter assembly 30A may have a first side 32A and a second side 34A opposing to the first side 32A. In addition to the transmissive substrate 40, the filter assembly 30A includes a first reflective layer 42A disposed adjacent to the transmissive substrate 40. The first reflective layer 42A may be a metal layer, like the one described above in the context of first reflective layer 42 in FIG. 1. The filter assembly 30A may also include at least one dielectric layer 44 adjacent to the first reflective layer 42A. A second reflective layer 46A may be disposed adjacent to dielectric layer 44 on a side opposite to the first reflective surface 42A. The second reflective layer 46A may be a metal layer. Together, a surface of the first reflective layer 42A close to the dielectric layer 44 and a surface of the second reflective layer 46A close to the dielectric layer 44 may form a pair of parallel reflective surfaces that sandwich the dielectric material layer 44. In one embodiment, the filter assembly 30A may have a "symmetric structure". The first reflective layer 42A may have substantially a same thickness as the second reflective layer 46A flanking the dielectric material layer 44.

In FIG. 2, the transmissive substrate 40 may define a visible surface 56 along the second side 34A. Thus, when a source 52 of electromagnetic radiation is directed towards the filter assembly 30A of the transmissive structural color filtering device 20A reaching the first side 32A, the filter assembly 30A is capable of transmitting a portion of a spectrum of electromagnetic radiation from the source 52 into the assembly 30A. Thus, a portion of electromagnetic radiation passes through the second reflective layer 46A to enter into the dielectric layer 44. As shown in the transmission-type Fabry-Përot based filter 20A of FIG. 2, the portion of electromagnetic radiation that enters the dielectric layer 44 resonates between the pair of parallel reflective surfaces (like a Fabry-Përot based etalon interference filter), namely the surface of the first reflective layer 42A and the surface of the second reflective layer 46A. A portion of the electromagnetic radiation is transmitted through the first reflective layer 42A and transmissive substrate 40, and a transmitted/filtered output 58 having a predetermined range of wavelengths may be generated and may exit the filter assembly 30A.

A thickness of a first metal layer (e.g., first reflective layer 42A in FIG. 2) disposed adjacent to the transmissive substrate (e.g., transmissive substrate 40) may be in a range of 5 nm (5 nm inclusive) to 50 nm (50 nm inclusive). A thickness of a second metal layer (e.g., second reflective layer 46A) disposed adjacent to the dielectric layer (e.g., dielectric layer 44) may be substantially the same as the thickness of the first metal layer. Therefore, the thickness of the second metal layer may be in a range of 5 nm (5 nm inclusive) to 50 nm (50 nm inclusive). The first and second metal layers are reflective, but are thin enough to facilitate transmission of the incoming portion of at least a portion of the electromagnetic spectrum (e.g., the source 52) through the filter assembly 30A, such that the output 58 may exit the filter assembly 30A.

In one embodiment, the filter assembly 30A may be capable of transmitting a portion of the electromagnetic spectrum through the first side 32A of the second reflective layer 46A into the dielectric layer 44. The transmitted portion of the electromagnetic spectrum is thus transmitted to and through the second side 34A of the first reflective layer 42A. Thus, the portion of the electromagnetic spectrum (e.g., the source 52) enters on the first side 32A of the filter assembly 30A and the filtered output 58 exits on a second side 34A. The structural color device may be a transmission-type filter and may generate the filtered output 58 that exits the filter assembly. A wavelength of the output 58 may be in a range of wavelengths of visible light. A predetermined range of wavelengths of the output 58 may include a color selected from the group consisting of: red, green, blue, and combinations thereof.

In some embodiments, the structural color filter may concurrently be both a transmission-type filter and a reflection-type filter, so that both transmitted light and reflected light may be generated after the electromagnetic spectrum enters the filter assembly. Thus, in these embodiments, a predetermined range of wavelengths of the transmitted light generated by the structural color filtering device may be a range of visible light and may include a color selected from the group consisting of: red, green, blue, and combinations thereof. The reflected light may include a color selected from the group consisting of: cyan, magenta, yellow, and combinations thereof, as well.

According to the above embodiment, the filter assemblies may generate a filtered output having a predetermined range of wavelengths that have minimal deviation when the filter assembly is observed from incidence angles ranging from 0 to 60°. Therefore, the angle dependence of the filter assembly may be reduced. For example, minimal deviation of a filtered output can be expressed as minimal angle dependence.

In some embodiments, minimal angle dependence of an optical filtering device may refer to a filtered output having a predetermined range of wavelengths that varies less than or equal to 80 nm; alternatively less than or equal to 70 nm; alternatively less than or equal to 60 nm when comparing a difference between a first wavelength at an incidence angle of 0° as compared to a second wavelength at an incidence angle of 60°. In some embodiments, minimal angle dependence of an optical filtering device corresponds to a filtered output having a predetermined range of wavelengths that varies (e.g., has a wavelength shift) of less than or equal to less than or equal to 50 nm; alternatively less than or equal to 45 nm; alternatively less than or equal to 40 nm; optionally less than or equal to 35 nm; alternatively less than or equal to 30 nm; based on a range of incidence potential angles (when comparing a difference between a first wavelength of interest observed at an incidence angle of 0° as compared to a second wavelength observed at an incidence angle of 60°).

In some embodiments, the structural color device filtering device provided by the present disclosure may be used as a color filter, such as a pixel, for a display device. Thus, the structural color device having minimal angle dependence may be useful in applications such as flat panel displays, liquid crystal displays, projection displays, eye-wear displays, complementary metal-oxide-semiconductor (CMOS) image sensors, light emitting diodes, and the like.

Figure 3:
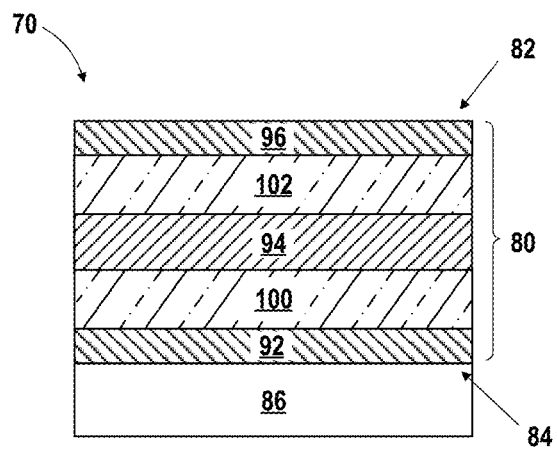
FIG. 3 is a schematic view of a multilayer structural color-filtering device according to an embodiment of the present disclosure.

As shown in FIG. 3, another symmetric structural color filtering device 70 may be provided. A filter assembly 80 may have a first side 82 and a second side 84 opposing to the first side 82. The filter assembly 80 is disposed on a substrate 86. As shown, the filter assembly 80 is a multilayered structure. The filter assembly 80 includes a first metal layer 92, a second metal layer 94, and a third metal layer 96, which may be formed of a same metal material with a same general thickness as described above in the context of the metal layers FIGS. 1 and 2. The first metal layer 92 is disposed adjacent to the substrate 86. A first dielectric layer 100 is disposed adjacent to the first metal layer 92, so that the first dielectric layer 100 is situated between the first metal layer 92 and the second metal layer 94. A second dielectric layer 102 is disposed between the second metal layer 94 and the third metal layer 96. The first and second dielectric layers 100, 102 may be made of a same refractive material having a same high refractive index. Thicknesses of the first and the second dielectric layers 100 and 102 may be in a same thickness range as described in the embodiments shown in FIG. 1 and FIG. 2. In some embodiments, the first dielectric layer 100 and the second dielectric layer 102 may have a same thickness. For example, the thickness of the dielectric layers may be greater than or equal to 50 nm. Notably, the second metal layer 94 disposed between the first dielectric layer 100 and the second dielectric layer 102 may have the same thickness as the first and second dielectric layers 100, 102, for example, greater than or equal to 50 nm. However, the first metal layer 92 and the third metal layer 96 may be thinner than the second metal layer 94. In some embodiments, the thicknesses of the first metal layer 92 and the third metal layer 96 may be in a range of 5 nm (5 nm inclusive) to 50 nm (50 nm inclusive). Further, the thicknesses of the first metal layer 92 and the second metal layer 96 may be the same, such that the filter assembly 80 may have a symmetric structure. In such a way, the symmetric filter assembly 80 may be removed from the substrate 80, for example, by being peeled off from the substrate so that a multilayered stack (e.g., 5 alternating layers of metal and dielectric layers) may be removed and ground into flakes or particles to serve as pigments for paint applications.

According to the present disclosure, a method of forming a structural color filter is provided. Such a method may include depositing a solid metal film on a surface of a working electrode, i.e., a first electrode, in contact with a first electrolyte by applying an electric potential. An electrolyte may be a liquid including at least one precursor compound capable of forming the solid metal film. When the electric potential is applied to the working electrode, it drives an electrochemical reaction of a first precursor at the surface of the working electrode to create a solid metal film. The solid metal film generated by the electrolytic deposition includes a metal selected from the group consisting of: gold (Au), copper (Cu), aluminum (Al), silver (Ag), and combinations thereof. In one embodiment, the depositing occurs at a temperature of less than or equal to 50° C. Further, the working electrode is electrically connected to a second electrode. A polarity of the working electrode is opposite to a polarity of the second electrode.

The solid metal film is generated by applying the electric potential to the first electrode or the working electrode (e.g., a cathode) in contact with a liquid electrolyte. The electric potential may drive an electrochemical reaction of the precursor in the liquid electrolyte to form the solid material at the surface of the working electrode. Thus, according to method provided in one embodiment, the liquid electrolyte may contact the first electrode, and the first electrode may be electrically connected with the second electrode. The first electrode and the second electrode may have opposite polarities. The liquid electrolyte contacting the first electrode may include the liquid electrolyte submerging the working electrode or applying the liquid electrolyte to the surface of the working electrode, for example, by spraying and the like. The liquid electrolyte can be formed by combining water and a precursor compound of a metal element selected from the group consisting of: gold (Au), copper (Cu), aluminum (Al), silver (Ag), or combinations thereof.

The first electrolyte may be an aqueous solution or suspension formed by combining water and/or polar solvents and at least one compound comprising a metal that may form the solid metal film. In some embodiments, the metal may be gold or copper, examples of precursor compounds include chloroauric acid, potassium dicyanoaurate, copper-citrate, copper-tartrate, copper-glycerol, silver cyanide, aluminum chloride, silver nitrate, silver diammine complex and combinations thereof. In other embodiments, the metal may include silver or aluminum, a variety of precursors known to those of skill in the art may be used. The precursor may also include silver cyanide and/or aluminum chloride. The precursor is not limited by the present disclosure. Alternatively, an anode is made of metal to be plated and metal plating occurs at the cathode.

The electrodeposited metal film may include gold, and the precursor may include chloroauric acid ($HAuCl_4$) and/or potassium dicyanoaurate. When the electrodeposited metal film includes copper, the precursor may include a copper complex selected from the group consisting of Cu(II)-citrate, copper-tartrate, copper-glycerol, and combinations thereof. A concentration of the metal precursor compound in the electrolyte may be greater than or equal to 0.1 mM. Ranges of pH values of the first electrolyte may depend on the precursor selected. In some embodiments, a pH of the electrolyte (e.g., an acidic electrolyte) may be less than or equal to 7, for example, may be less than or equal to 3. In other embodiments, the pH of the electrolyte (e.g., a basic electrolyte) may be greater than or equal to 7. In still other embodiments, the pH of the electrolyte may range from 7 (7 inclusive) to 12 (12 inclusive). When a concentration of the precursor is small (e.g., about 0.1 mM), a supporting salt (potassium chloride, potassium nitrate, and the like) may be added to the electrolyte to increase the ionic strength. Additionally, in some embodiments, an acid or base may be added to the electrolyte to control the pH. For example, when the pH of the electrolyte is less than 7, an acid may be added, such as sulfuric acid, which will not be limited by the present disclosure. When the pH of the electroly is greater than 7, a base may be added, such as sodium hydroxide, which will not be limited by the present disclosure.

The electric potential may be applied to the working electrode in contact with the electrolyte to drive an electrochemical reduction reaction on the surface of the working electrode exposed to the electrolyte, such that a solid material including a metal element may be generated. In one embodiment, a first metal layer may be generated via gold electrodeposition. Specifically, a voltage may be applied, for example, in an amount equal to or more negative than $-0.3$ V vs E(Ag/AgCl) to more positive than or equal to $-2$ V vs E(Ag/AgCl). A current density during the electrodeposition to generate the first metal layer may range from 1 mA cm$^{-2}$ (1 mA cm$^{-2}$ inclusive) to 12 mA cm$^{-2}$ (12 mA cm$^{-2}$ inclusive). In another embodiment, the first metal layer may be generated via copper electrodeposition, and the current density may be in a range from 1 mA cm$^{-2}$ (1 mA cm$^{-2}$ inclusive) to 5 mA cm$^{-2}$ (5 mA cm$^{-2}$ inclusive) when applying the first metal layer. The voltage potential (E) during electrodeposition of the first metal layer may range from equal to or more negative than $-0.42$ V versus E(Ag/AgCl) to more positive than or equal to $-1$ V versus E(Ag/AgCl).

Further, the method may include depositing the dielectric material layer on the solid metal film by contacting the working electrode with a second electrolyte including a second precursor. The second precursor may include at least one compound capable of forming the dielectric material layer. After the depositing the dielectric material layer, the solid metal film and the dielectric material layer may be capable of being assembled together with a second metal layer to define the structural color filter. As discussed herein, the dielectric material layer may include cuprous oxide (Cu$_2$O), amorphous silicon (a-Si), zinc oxide (ZnO), zirconium oxide (ZrO$_2$) and/or titanium oxide (TiO$_2$). Therefore, the precursor for forming the dielectric material layer may include copper, silicon, zinc, zirconium, and/or titanium.

Suitable precursors include copper sulfate (CuSO$_4$) (combined with citric acid), trichlorosilane (SiHCl$_3$) (dissolved in an organic solvent (propylene carbonate) that can form a-Si), zinc nitrate (Zn(NO$_3$)$_2$), or titanium powder (Ti$^0$). Titanium powder may be converted to titanium oxyhydroxide gel and then annealed to form TiO$_2$. The second electrolyte may be aqueous and include water. A pH value of the electrolyte may be greater than or equal to 7, greater than or equal to 10, or greater than or equal to 11.

A current may be applied, for example, when electrodepositing cuprous oxide (Cu$_2$O) to form the dielectric material layer. A current density may be in a range of 0.01 mA/cm$^2$ (0.01 mA/cm$^2$ inclusive) to 0.1 mA/cm$^2$ (0.01 mA/cm$^2$ inclusive). The voltage potential (E) during electrodeposition of the dielectric layer may range from more negative than or equal to $-0.1$ V versus E(Ag/AgCl) to less negative than or equal to $-0.41$ V versus E(Ag/AgCl). For the deposition of the dielectric material over the first metal layer, the current density may range from greater than or equal to 0.05 mA/cm$^2$ to less than or equal to 0.1 mA/cm$^2$.

In some embodiments, the dielectric material layer may be a first dielectric material layer and the method further include depositing one or more additional dielectric material layers over the first dielectric material layer in a similar manner to the process described above. Arranging additional dielectric material layers may improve color purity of the structural color filtering device. Notably, in some embodiments, a stack may be provided and include two dielectric layers arranged at a top and a bottom (exposed surfaces) of the stack respectively to serve as protection and to enhance the color purity of the device. For example, a third dielectric material layer may define a first exposed surface (the top) of the multilayered stack and a fourth dielectric material layer may define a second exposed surface (the bottom) of the stack.

In some embodiments, the method further includes depositing the second metal layer via an electrolytic deposition process by contacting the working electrode arranged with the solid metal film and dielectric material layer with a third electrolyte including a third precursor. The electrodeposition process may be performed to avoid degradation of the underlying dielectric material layer. In some embodiments, the third electrolyte may be basic and have a pH of greater than 7, for example, greater than or equal to 10. In other embodiments, the pH may be greater than or equal to 10 to less than or equal to 11. The third precursor may include a metal element selected from the group consisting of: gold (Au), copper (Cu), aluminum (Al), silver (Ag), or combinations thereof. An appropriate precursor may be selected such that integrity of the underlying dielectric layer may be maintained. For example, the precursor may be applied via a basic electrolyte, and the pH of the third electrolyte may be greater than 7.

The electrodeposited metal film may include gold, the precursor may include chloroauric acid (HAuCl$_4$). The electrolyte is treated to create an alkaline formula. If the electrodeposited metal film includes copper, the precursor may include a copper complex selected from the group consisting of Cu(II)-citrate, copper-tartrate, copper-glycerol, and combinations thereof, such that the precursor may be deposited in a basic electrolyte via the electrodeposition process. Such electrodeposition precursors and processes are described in Ballesteros, J. C. et al., "Electrodeposition of Copper from Non-Cyanide Alkaline Solution Containing Tartrate," *Int. J. Electrochem. Sci.*, Vol. 6, pp. 2632-2651 (2011), Aniruddha Joi, et al., "Additives for Bottom-up Copper Plating from an Alkaline Complexed Electrolyte," J. Electrochem. Soc. 160 (12): pp. D3001-D3003 (2013), and P. Sivasakthi, et al., "Electrodeposition and characterization of copper deposited from cyanide-free alkaline glycerol complex bath," Transactions of the IMF, 93:1, pp. 32-37, (2015), the relevant portions of each of which are incorporated herein by reference. A concentration of the second metal precursor compound in the electrolyte may range from greater than or equal to 0.1 mM. The pH may range from 10 to 12. This pH may be adjusted to be within a proper range so that the Cu$_2$O may not be chemically affected by the electrolyte. When the concentration of the precursor is small (e.g., 0.1 mM), a supporting salt (potassium chloride, potassium nitrate, and the like) may be added to the electrolyte to increase the ionic strength. Thus, here, a sodium hydroxide (a base) is added to the electrolyte to obtain an alkaline electrolyte.

For deposition of the second metal layer including gold over the dielectric material layer, a voltage may be applied, for example, in an amount equal to or more negative than $-0.3$ V vs E(Ag/AgCl) to more positive than or equal to $-1$ V vs E(Ag/AgCl). The current density during the electrodeposition of the first metal layer including gold may range from greater than or equal to 0.5 mA cm$^{-2}$ to less than or equal to 3 mA cm$^{-2}$. For copper electrodeposition, the current density may range from greater than or equal to 1 mA cm$^{-2}$ to less than or equal to 5 mA cm$^{-2}$. The voltage potential (E) during electrodeposition for copper electrodeposition may range from more negative than or equal to $-0.42$ V versus E(Ag/AgCl) to more positive than or equal to $-1$ V versus E(Ag/AgCl).

In other embodiments, the method may include depositing the second metal layer via another process, such as an electroless deposition process. During the electroless deposition process, an autocatalytic reaction may be induced and create a metal coating on a substrate in the absence of the current or the voltage. In one embodiment, the method may include depositing silver, for example, as the second metal layer over the dielectric material layer.

The electroless deposition process may be referred as a "Peacock Silvering" process, which while not limiting to any particular theory is believed to work as follows. The Peacock Silvering process may involve four distinct solutions. A first solution may be a silver solution designated "HE-300A". The first solution may be a silver precursor containing silver diammine complex, sodium hydroxide, and water. A second solution may be a silver activator designated "HE-300B". The second solution may contain sodium hydroxide and ammonium hydroxide. A third solution may be "HE-300C," which is a proprietary reducer solution. The third solution may contain propanol, hydrochloric acid, stannous chloride, and a proprietary chemical. A fourth solution may be a sensitizing solution designated as "No. 93 Sensitizing Solution". The fourth solution may contain a stannous chloride reducing agent and a propriety chemical.

The Peacock Silvering process may include following operations. A surface to be coated with a smooth solid silver film may be exposed to the sensitizing solution. The silver precursor solution and the silver activator solution may be mixed together in equal parts. When the silver activator solution is mixed with silver solution, the silver precursor is activated due to the pH change. Subsequently, equal parts of mixture of the silver activator and the silver solution and the reducer solution may be mixed together to prepare the final solution. The silver diammine may dissociate into $Ag^+$ (and remains stable in this state) only within a certain range of pH (and the certain range of pH may be achieved by the activator solution). In such a way, the surface to be coated with a smooth solid silver film may be introduced into a final solution of the silvering process.

When the activated precursor is mixed with the reducer solution, the $Ag^+$ ions may be reduced to $Ag^0$ in solution. The mixed solution of the activated precursor and the reducer solution may be sprayed/dropcast onto a substrate, and the $Ag^0$ may precipitate thereon.

However, not all $Ag^+$ ions are necessarily reduced by the reducing agent. Also, precipitation of the $Ag^0$ randomly on the surface of the substrate may not provide a smooth film. Thus, to ensure a mirror-like smooth finish, the substrate may be treated with the sensitizing solution and then rinsed with water. Contents of the sensitizing solution may be adsorbed on the surface of the substrate. Such the operation may be performed before introducing the surface to be coated into the final silvering solution, as described above.

Stannous Chloride (present in the sensitizing solution) may be a reducing agent. Stannous Chloride may exist as $Sn^{2+}$ and $2Cl^-$ in water (and the $Sn^{2+}$ may be adsorbed onto the substrate surface). When the mixed solution of the activated precursor and the reducer solution is sprayed/dropcast onto the surface of the substrate, the $Sn^{2+}$ may release two electrons, whereas the $Ag^+$ may take the two electrons and deposits on the surface of the substrate (as reflected by the equation below).

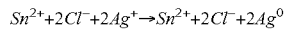

$$Sn^{2+}+2Cl^-+2Ag^+ \rightarrow Sn^{2+}+2Cl^-+2Ag^0$$

In such away, a thin smooth silver coating may be formed via an electroless deposition process on the substrate, which may include the previously deposited dielectric material layer deposited over the first metal layer.

Other methods of applying a smooth second metal layer over the dielectric material are also contemplated. In some embodiments, the smooth second metal layer may be synthesized on a substrate by physical vapor deposition (PVD), chemical vapor deposition (CVD), or atomic layer deposition (ALD). Also, other known conventional processes to apply or deposit the smooth second metal layer to solid materials may be performed, such as wet chemistry or sol-gel techniques. In some embodiments, the deposition may be achieved via a physical vapor deposition (PVD) process. The smooth second metal layer may be an alloy, two distinct metal sources (e.g., Ag and Al) may be co-deposited via a PVD sputtering process, such as magnetron sputtering, or thermal evaporation, electron beam evaporation and other similar processes. Such a co-sputtering process for forming a smooth metal alloy coating is described in U.S. Pub. No. 2017/0200526 to Guo et al., the relevant portions of which are incorporated herein by reference. Notably, any process able to form the smooth second metal layer may be performed to ensure stability of the underlying dielectric material layer. While such alternative processes to apply the second metal layer may employ vacuum conditions or other expensive processes, a majority of the layers of the structural color device may be formed at ambient conditions via the electrodeposition to provide a more economical structural colorant.

Figure 3A:
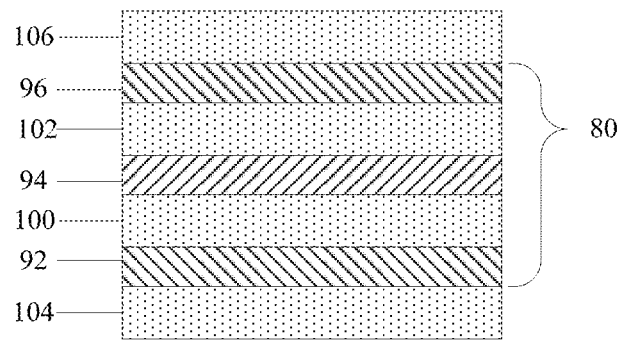
FIG. 3A is a schematic view of a multilayer structural color-filtering device according to an embodiment of the present disclosure.

Further in some embodiments, as shown in FIG. 3A, by performing the electrodeposition operations, the first metal layer 92, the first dielectric layer 100, the second metal layer 94, the second dielectric layer 102, and the third metal layer 96 may form a stack 80. The method provided in the present disclosure may further include: forming a third dielectric layer 104 adjacent to the first metal layer 92 and forming a fourth dielectric layer 106 adjacent to the third metal layer 96. Operations of forming the third and the fourth dielectric layers 104 and 106 may refer to the operations of depositing the first, the second, and the third dielectric layers as described in the above. In such a way, the third dielectric layer 104 and the first dielectric layer 100 are formed on two opposing sides of the first metal layer 92, and the fourth dielectric layer 106 and the second dielectric layer 102 are formed on two opposing sides of the third metal layer 96.

It should be noted that in some embodiments, any metal layer or dielectric material layer may include multiple metal layers or multiple layers of dielectric materials. Each of the multiple layers may have a same composition. In other embodiments, the multilayered components may have distinct compositions. That is, the metal layer may include multiple metal layers, and the multiple metal layers may have distinct compositions, and the dielectric layer may include multiple dielectric layers, and the multiple dielectric layers may have distinct compositions. Furthermore, the number of layers applied may differ from those shown to form structural color devices.

Figure 4:
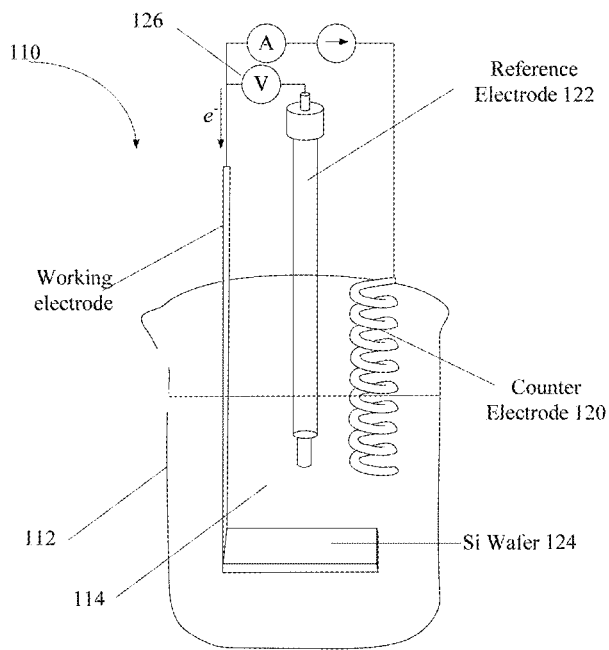
FIG. 4 is a schematic view of a three-electrode electrochemical cell in which a structural color device may be formed according to an embodiment of the present disclosure.

A standard three-electrode electrochemical cell 110 setup may be provided for the electrodeposition process, as shown in FIG. 4. A vessel or container 112 may be provided and contain an electrolyte 114. The electrolyte 114 may contain at least one precursor, and the at least one precursor may include a metal to be electrodeposited. A counter electrode 120, for example, a platinum mesh counter electrode, may be arranged in contact with the electrolyte 114. A suitable reference electrode 122 may be arranged as part of the three-electrode electrochemical cell 110. An $n^+$ Si (111) substrate (i.e., a silicon wafer) may be arranged to be submerged by the electrolyte 114 and serve as a working electrode 124. The silicon wafer working electrode 124 may be electrically connected with the counter electrode 120 and the reference electrode 122. The working electrode 124 and the counter electrode 120 may be electrically connected to a source of an electrical potential/current 126.

It is noted that the reference electrode 122 may be omitted in the standard three-electrode electrochemical cell 110. The reference electrode 122 may include a silver/silver chloride (Ag/AgCl) reference electrode, a saturated calomel electrode, and a mercury/mercury sulfate electrode (MSE). The reference electrode 122 may be determined based on a pH of the electrodeposition solution. It may be seen that the above reference electrodes may employ different redox species and have different electrode designs. The Ag/AgCl reference electrode may be one of the most common reference electrodes used, but tend to degrade over time when being used in basic/alkaline solutions (e.g., pH>7). The mercury/mercury sulfate electrode (MSE) on the other hand may be stable at basic pH (e.g., pH>7). The Ag/AgCl may work in solutions having pH of greater than 7, the electrode may degrade over time and may be required to be replaced. Therefore, the Ag/AgCl reference electrode may be arranged in the standard three-electrode electrochemical cell 110 when the pH of the electrodeposition solution is less than 7, while the MSE electrode may be arranged in the standard three-electrode electrochemical cell 110 when the pH of the electrodeposition solution may be greater than 7. Therefore, in one embodiment, an Ag/AgCl (sat. KCl) electrode may be employed as the reference electrode 122. In other embodiments, the reference electrode may be mercury sulfate electrode (MSE) (sat. $K_2SO_4$) reference electrode. In one embodiment, the reference electrode 122 may be able to monitor one or more parameters selected from the group consisting of nucleation of material, material thickness, and rate of deposition of material, by way of example.

Notably, while the standard three-electrode electrochemical cell 110 shown in FIG. 4 is conducted as a batch process to form the coating, the electrolyte in the container may be replaced, such a process could be conducted in multiple distinct electrochemical cell stations as a semi-continuous process. Alternatively, the process may also be conducted as a continuous process, for example, processing the substrates on a conveyor belt or as a roll-to-roll (R2R) process, where the substrate passes through different stations having different electrolyte baths (or spray stations for different electrolyte). Such continuous processes can facilitate high-speed fabrication of the structural color coatings on flexible substrates.

In some embodiments, the present disclosure contemplates forming a smooth and thin film including a metal selected from the group consisting of: gold (Au), copper (Cu), aluminum (Al), silver (Ag), or combinations thereof. In some embodiments, the "thin" film means that the film may have a thickness of less than or equal to 150 nm, less than or equal to 125 nm, less than or equal to 100 nm, less than or equal to 75 nm, less than or equal to 50 nm, less than or equal to 45 nm, less than or equal to 40 nm, less than or equal to 35 nm, less than or equal to 30 nm, less than or equal to 25 nm, less than or equal to 20 nm, less than or equal to 15 nm, or less than or equal to 10 nm. In some embodiments, the thickness of the film may be "ultra-thin" and may be less than or equal to 25 nm. In some embodiments, the thickness of the film may be greater than or equal to 5 nm and less than or equal to 100 nm; greater than or equal to 5 nm to less than or equal to 75 nm; greater than or equal to 5 nm to less than or equal to 50 nm; greater than or equal to 5 nm to less than or equal to 20 nm, or greater than or equal to 5 nm to less than or equal to 15 nm.

Furthermore, in some embodiments, the thin film may have a smooth surface. The thin film having the smooth surface means that a root mean squared (RMS) of measured surface roughness (e.g., from peaks to valleys) is less than or equal to 25% of the total film thickness, less than or equal to about 20% of the total film thickness, less than or equal to 15% of the total film thickness, less than or equal to 14% of the total film thickness, less than or equal to 13% of the total film thickness, less than or equal to 12% of the total film thickness, less than or equal to 11% of the total film thickness, less than or equal to 10% of the total film thickness, less than or equal to 9% of the total film thickness, less than or equal to 8% of the total film thickness, less than or equal to 7% of the total film thickness, less than or equal to 6% of the total film thickness, or less than or equal to 5% of the total film thickness.

As appreciated by those of skill in the art, ascertaining smoothness of a film may be relative and depend on an overall thickness of the film, and therefore, greater amounts of root mean squared (RMS) surface roughness may still indicate the film having a smooth surface if the film is thicker. In some embodiments, the smooth surface of the metal film may have a surface roughness of less than or equal to about 1 nm root mean squared (RMS), when an overall thickness of the film is at least about 10 nm. In other embodiments, the smooth surface may have a surface roughness of less than or equal to about 0.5 nm root mean squared (RMS), when an overall thickness of the film is at least about 10 nm.

In other embodiments, a surface profile (a two-dimensional profile of a surface taken perpendicular to the lay, if any) of the smooth metal coating may have an average surface roughness ($R_{avg}$) of less than or equal to about 10 nm, less than or equal to 5 nm, or less than or equal to about 3 nm.

In other embodiments, the smooth metal coating electrodeposited may be "conformal" to the underlying substrate surface. The conformal coating may coat complex three-dimensional substrates, such as an object having a curved surface or a rough surface. Generally, the conformal coating may indicate that the coating may uniformly contact greater than or equal to about 85% of an exposed surface area of the underlying substrate, greater than or equal to 90% of the exposed surface area of the underlying substrate, greater than or equal to 95% of the exposed surface area of the underlying substrate, greater than or equal to 97% of the exposed surface area of the underlying substrate, greater than or equal to 98% of the exposed surface area of the underlying substrate, or greater than or equal to 99% of the exposed surface area of the underlying substrate.

In some embodiments, the smooth metal film may have a substantially uniform thickness, and that is, a thickness of the smooth metal film at a first position may deviate less than or equal to 40% of a thickness of the smooth metal film at a second position. Alternatively, thickness deviation may be less than or equal to about 30%, less than or equal to 25%, or less than or equal to about 20%. For example, a first thickness of a first position of the smooth metal film may deviate less than 40% from a second thickness of a second position of the body of the smooth metal film, such that the first thickness at the first position may be 20 nm, the second thickness at the second position may range between 12 nm and 28 nm.

The smooth thin film may also be electrically conductive. The electrically conductive smooth thin film formed by the solution-based method provided in the present disclosure may have a sheet resistance of less than or equal to about 100

Ohm/square, less than or equal to about 75 Ohm/square, less than or equal to 50 Ohm/square, less than or equal to 40 Ohm/square, less than or equal to 30 Ohm/square, less than or equal to 25 Ohm/square, less than or equal to 20 Ohm/square, less than or equal to 15 Ohm/square, less than or equal to about 10 Ohm/square, less than or equal to 5 Ohm/square, less than or equal to 4 Ohm/square, less than or equal to 3 Ohm/square, less than or equal to 2 Ohm/square, and less than or equal to 1 Ohm/square.

The ultra-thin and smooth film formed by solution-based techniques provided in the present disclosure may have high optical quality, a low optical loss, and low electrical resistance. The optical loss relates to material absorption in the structure, and the material absorption=100%-reflection %-transmission %. The low optical loss may refer to absorption of less than or equal to 30%, less than or equal to 25%, less than or equal to 20%, less than or equal to 15%, less than or equal to 10%, less than or equal to 5%, less than or equal to 3%, less than or equal to 2%, or less than or equal to 1%. In some embodiments, the electrodeposited metal film or coating may be a high quality epitaxial film, meaning that the metal film may be crystalline. In some embodiments, the high quality may refer to the film being smooth, continuous, and having low optical absorption. Thus, the film quality can be assessed by measuring the surface roughness and optical absorption of the film, as described above.

The smooth metal thin film formed by the solution-based processes provided in the present disclosure may be capable of transmitting a portion of the electromagnetic spectrum and thus may be transparent or semi-transparent. Transparency may generally encompass semi-transparency, and may be understood generally to mean that greater than or equal to about 40% of a predetermined target wavelength or range of wavelengths (which may be polarized or non-polarized) of light/energy pass through the electrically conductive thin film. In some embodiments, greater than or equal to about 50% of the target wavelength (or range of wavelengths) may pass through the thin film. Alternatively, greater than or equal to 60%, greater than or equal to 70%, greater than or equal to 75%, greater than or equal to 80%, greater than or equal to 85%, greater than or equal to 90%, greater than or equal to 95%, or greater than or equal to 97% of the target wavelength may pass through the thin metal film coatings of the present disclosure.

In some embodiments, the smooth metal thin film coatings may be reflective or semi-reflective, and therefore, it may reflect certain portions of the electromagnetic spectrum. As reflectivity may generally encompass semi-reflectivity, in one embodiment, it may be understood that greater than or equal to about 50% of the predetermined target wavelength or range of wavelengths (which may be polarized or non-polarized) of light/energy may be reflected from a surface and therefore do not pass through the electrically conductive thin film. In some embodiments, greater than or equal to 60% of the predetermined target wavelength (or range of wavelengths) may be reflected from the thin film. Alternatively, greater than or equal to 70%, greater than or equal to 75%, greater than or equal to 80%, greater than or equal to 85%, greater than or equal to 90%, greater than or equal to 95%, or greater than or equal to 97% of the target wavelength(s) may be reflected by the metal thin film coating.

The present disclosure may be further understood by the specific examples herein. Specific Examples are provided for illustrative purposes of how to make and use the methods, compositions, devices according to the present teachings and, unless explicitly stated otherwise, are not intended to be a representation that given embodiments of this invention have, or have not, been made or tested.

EXAMPLES

An asymmetric metal-dielectric-metal multilayered structure may be formed by electrodeposition of a gold (Au) and cuprous oxide ($Cu_2O$) thin-film smoothly on a conductive substrate, defining an effective optical cavity. Different colors of high brightness levels may be formed by tuning a thickness of the middle cavity dielectric material layer. Due to the high refractive index of the middle dielectric layer ($Cu_2O$), the generated colors may not be varied in response to various incident angles. Such methods have significant advantages over traditional deposition or assembling methods, offering the feasibility of decorating surfaces of any shape and roughness, which can potentially extend the applicability of structural colors at lower cost.

The exemplary structural color optical spectrum filter design is based on a tri-layer asymmetric metal/dielectric/metal (MDM) Fabry-Pérot (F-P) cavity. Being similar to that shown in FIG. 1, thicknesses of a top metal layer and a bottom metal layer may be fixed. The top and bottom metal layers may include gold (Au), and the top metal layer is thinner than the bottom metal layer. Further, the top and bottom metal layers may be disposed at two opposing sides of a dielectric layer made of cuprous oxide ($Cu_2O$). The thickness of the dielectric layer may be adjusted to generate different colors from the structural filter device, which all have a high brightness level. Due to the high refractive index of the middle dielectric layer, the device structure exhibit angle-insensitive colored appearance up to ±60°, which is highly desirable for various applications. This is believed to be the first demonstration utilizing electrodeposition to achieve all-solution processed structural colors. The methods provided in accordance with certain aspects of the present disclosure are superior to traditional deposition or assembly techniques, making it feasible to directly deposit structural color filters and to decorate surfaces of any size, shape, roughness, and the like at low cost, thus potentially leading to more extensive use of structural colors in a variety of applications.

Example 1

Figure 5A:
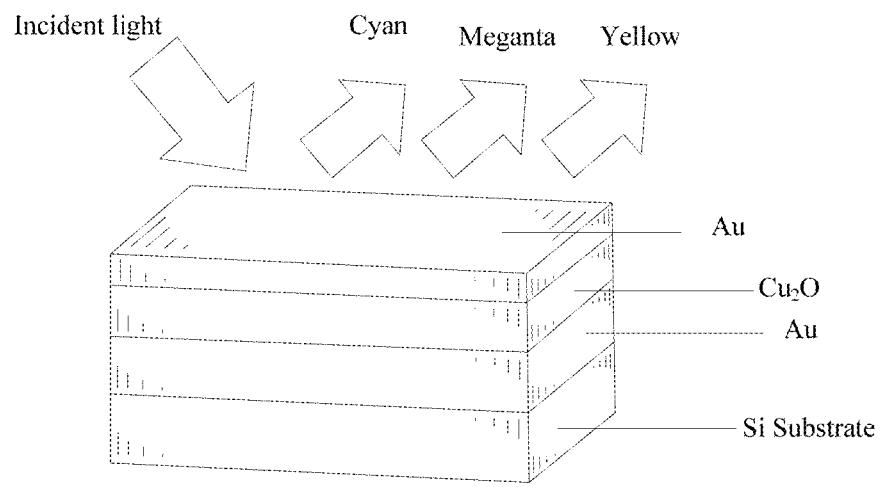
FIG. 5A is a schematic view of a structural color device design according to an embodiment of the present disclosure.

FIG. 5A is a schematic view of the solution processed structural color filter device including an Au/$Cu_2O$/Au tri-layer stack (MDM stacks) sequentially electrodeposited on a crystalline silicon (Si) substrate in accordance with certain aspects of the present disclosure, like those described in this example.

Acetone (ACS grade, Fisher Scientific), methanol (ACS grade, Fisher Scientific), 2-propanol (ACS grade, Fisher Scientific), buffered hydrofluoric acid (BHF) (Transene Inc.), hydrofluoric acid (HF) (49%, Transene Inc.), gold (III) chloride trihydrate ($HAuCl_4.3H_2O$) (>99.9% Sigma-Aldrich), potassium sulfate ($K_2SO_4$) (ACS grade, Fisher Scientific), potassium chloride (KCl) (ACS grade, Fisher Scientific), sulfuric acid ($H_2SO_4$) (0.1 M eluent concentrate for IC, Sigma-Aldrich), copper (II) sulfate pentahydrate ($CuSO_4.5H_2O$) (ACS grade, Avantor), citric acid (>99.5% ACS grade, Sigma-Aldrich), sodium hydroxide (NaOH) (>98% ACS grade, Sigma-Aldrich), indium (99.99%, Gallium Source), gallium (99.999%, Alfa Aesar) are used as received. Degenerately doped n-type Si (111) wafers with a+/−0.5 degrees miscut (0.525±0.020 mm, ρ<0.007 Ω·cm, Addison Engineering, Inc.) may be diced and used as substrates. Deionized (DI) water with a resistivity >18.2 MΩ·cm may be used throughout.

Substrate Preparation

_An n+Si (111) substrate and a stainless-steel spoon may be degreased by being sonicated for five minutes in acetone, methanol, isopropyl alcohol, and water, and then dried under a nitrogen ($N_2$) gas stream, sequentially. To create an H-terminated Si surface, the n+Si (111) substrate may be immersed in 5% HF for 30 seconds to etch native oxide and soaked in DI water at T=95° C. for 20 minutes to create a fresh silicon oxide ($SiO_x$) passivating layer. The n+Si (111) substrate may be then etched sequentially in 5% HF and BHIF for 30 seconds each to create the H-terminated Si surface. The n+Si (111) substrate may be rinsed in DI water and dried under a $N_2$ stream and immediately used for the electrodeposition operation. The stainless-steel spoon may be used directly after being degreased.

Electrodeposition of Au and $Cu_2O$

All electrochemical deposition operations may be performed in a three-electrode cell in lab ambient and T≤50° C., like that described above. Computer controlled potentiostats (CHI760C, CH Instruments and Solartron Analytical 1287A, AMETEK Scientific Instruments) may be used for the electrochemical deposition operations. A platinum mesh counter electrode may be used for all electrodeposition deposition operations, whereas the reference electrode may be determined based on the pH of the electrodeposition solution.

A stock solution of 0.1 mM $HAuCl_4·3H_2O$, 1 mM KCl, and 100 mM $K_2SO_4$ in DI water may be prepared for Au electrodeposition. To perform the bottom Au electrodeposition, a portion of the stock solution may be obtained and 1 mM $H_2SO_4$ may be added to it to adjust the pH of the stock solution to be approximately 3. An Ag/AgCl (sat. KCl) electrode may be employed as the reference electrode. An Ohmic contact to the Si substrate may be made by applying eutectic gallium-indium (EGaIn) to a region, such as a tip, of the wafer and clipping the working electrode of the potentiostat to the region.

During performing electrodeposition on the stainless-steel spoon, the working electrode of the potentiostat may be directly clipped on to an end of the spoon. The Si substrate may be pre-polarized by applying a potential of E=−1.9 V vs. Ag/AgCl and then immersed into the solution. The pre-polarization operation may be necessary to avoid electroless plating of Au and formation of a native oxide layer on Si that could prevent epitaxial Au growth. Based on the voltammetric responses of the stainless-steel spoon in the deposition solution, a potential of E=−1.45 V vs. Ag/AgCl may be determined for Au electrodeposition on the spoons in order to avoid the excessive hydrogen evolution reaction (HER) at E=−1.9 V vs. Ag/AgCl. In one embodiment, a plurality of stainless-steel spoons may be electrodeposited, and the Au growth on the stainless-steel spoons may be achieved by stirring for 40 minutes at T 35° C. with a stir rate of 200 rpm, yielding an Au film with a uniform thickness of approximate 40.

$Cu_2O$ may be electrodeposited from alkaline Cu(II)-citrate solutions, as being demonstrated in the above. An aqueous solution of 0.4 M $CuSO_4·5H_2O$ and 1.6 M citric acid may be prepared and NaOH may be slowly added to the aqueous solution to raise the pH to be approximately 10.9. A mercury sulfate electrode (MSE) (sat. $K_2SO_4$) may be employed as the reference electrode in the three-electrode cell, and the Au-coated Si substrate and Au-coated stainless-steel spoon obtained above may be used as the working electrode. KAPTON™ tape may be used to define a total active area of the working electrode in contact with the solution. The cathodic current density during the electrodeposition may be tuned between 0.05 to 0.1 mA/$cm^2$ to ensure the potential measured during electrodeposition to not exceed E=−0.85 V vs. MSE (−0.41 V vs. Ag/AgCl), in order to avoid any Cu deposition during the $Cu_2O$ electrodeposition operation. The electrodeposition operation may be performed at T=50° C. and a stir rate of 200 rpm with a potential of E=−0.6 to −0.85 V vs. MSE (−0.16 V to −0.41 V vs. Ag/AgCl), such that the $Cu_2O$ electrodeposition with a uniform speed may be achieved.

During performing the electrodeposition of the top Au layer, an alkaline solution may be utilized to prevent etching of the $Cu_2O$ layer. A portion of the stock solution prepared above may be obtained, and the pH of the portion may be adjusted to be approximately 10-11 by addition of NaOH. A MSE (sat. $K_2SO_4$) reference electrode may be used for the electrodeposition, and the Si substrate and stainless-steel spoon coated with Au/$Cu_2O$ may be used as the working electrode. The top Au layer (approximately 15 nm thick) may be electrodeposited at E=−1.1 V vs. MSE (−0.66 V vs. Ag/AgCl) at T=50° C. with a stir rate of 200 rpm for 30 minutes.

Optical Simulation

Simulation results of reflection spectra and the net phase shift within the $Cu_2O$ layer may be calculated based on a transfer matrix method with the refractive indices of materials calibrated using a spectroscopic ellipsometer (M-2000, J. A. Woollam Co.).

Device Characterization

The reflection spectra from normal incidence may be measured using a thin-film measurement instrument (F20, Filmetrics) integrated with a spectrometer and a white light source. Angle-resolved reflection spectra of the fabricated device and a thickness of each layer may be characterized by using a spectroscopic ellipsometer (M-2000, J. A. Woollam Co.). Due to limitation of tool capability, a smallest incident angle of the ellipsometer may be 45 for the reflection measurement. Thus, the measured spectra in FIG. 4 may have an angular range from 40° to 60°. Simulations may be performed from 0° to 600 degrees to illustrate the wide range of angle insensitivity for the structural colors generated by the device of the present disclosure. Cross-sectional electro-microscopic scanning may be performed with a SU8000 FE-SEM (Hitachi High-Technologies Corporation) with a Schottky field emitter operated at 5 keV beam voltage. Surface morphology of each layer may be investigated using tapping mode atomic force microscopy (Dimension Icon AFM, Bruker Corporation).

Results

As noted above, to obtain the solution-processed structural color device with high reflectivity on a planar surface, the hydrogen (H)-terminated crystalline $n^+$ Si (111) substrate with a small miscut angle may be arranged to achieve high smoothness of the electrodeposited metal-dielectric-metal (MDM) layers, which will be discussed later in detail. The thicknesses of the bottom and top gold (Au) layers may be fixed at 40 nm and 15 nm, respectively, the thickness of the middle dielectric layer ($Cu_2O$) layer may be adjusted for obtaining cyan (thickness of about 70 nm), magenta (thickness of about 45 nm), and yellow (thickness of about 20 nm) (CMY) colors by exciting absorption resonances at different wavelength positions. Measured reflection spectra (dashed curves) of the CMY structural color devices are provided in FIG. 5B. The measured reflected spectra are in great agreement with the simulated results (solid curves). The insets correspond to photographs of the fabricated devices showing distinctive and uniform CMY colors over a large scale.

Figure 6A:
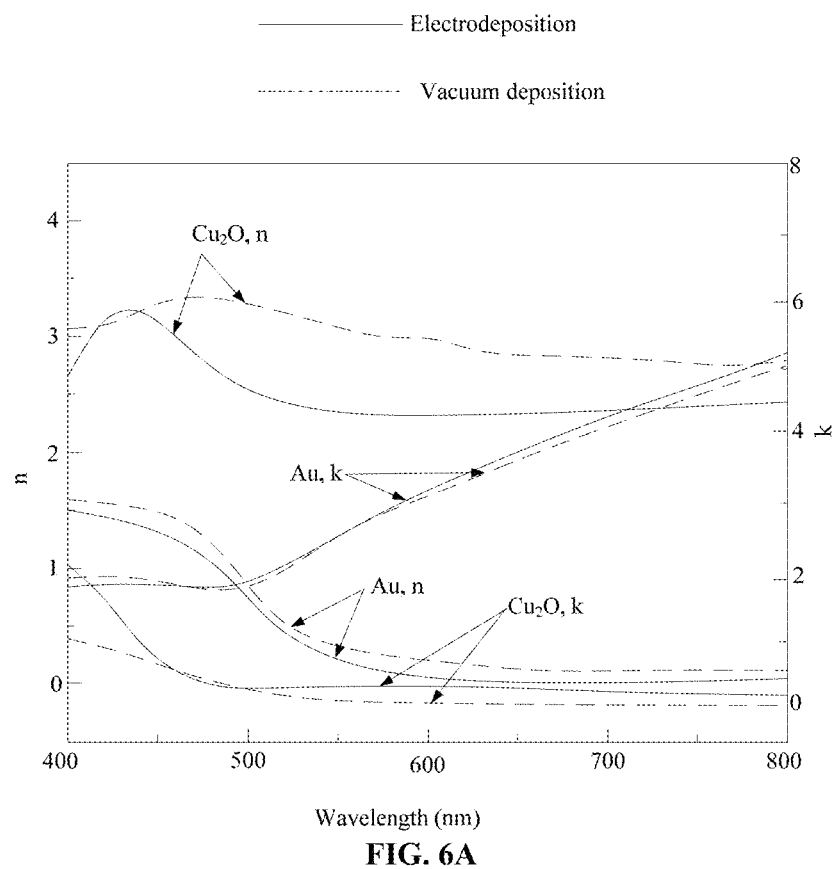
FIG. 6A shows curves of refractive indices of gold and cuprous oxide deposited by electrodeposition and vacuum deposition according to an embodiment of the present disclosure.

The simulations are performed based on the transfer matrix method with the refractive indices and thicknesses of Au and Cu$_2$O layers characterized using a spectroscopic ellipsometer (M-2000, J. A. Woollam Co.). As shown in FIG. 6A, the refractive indices (n+ik, n and k are the real and imaginary parts of the refractive index, respectively) of the electrodeposited Au and Cu$_2$O films are both fairly similar to that of the corresponding materials prepared by vacuum-based deposition techniques, indicating the high optical quality of these solution processed thin-films. The refractive index of the reference Au is characterized using Au films grown by e-beam evaporation and the reference data for reactively-sputtered Cu$_2$O is extracted from Drobny, V F. et al, "Properties of reactively-sputtered copper oxide thin films," *Thin Solid Films*, 61, pp. 89-98 (1979), the relevant portions of which are incorporated herein by reference. It should be noted that the slightly smaller refractive index (the real part n) of the electrodeposited Cu$_2$O compared to that of the reference Cu$_2$O will result in the need for a slightly thicker cavity layer when generating a reflection dip at any given wavelength.

Figure 5B:
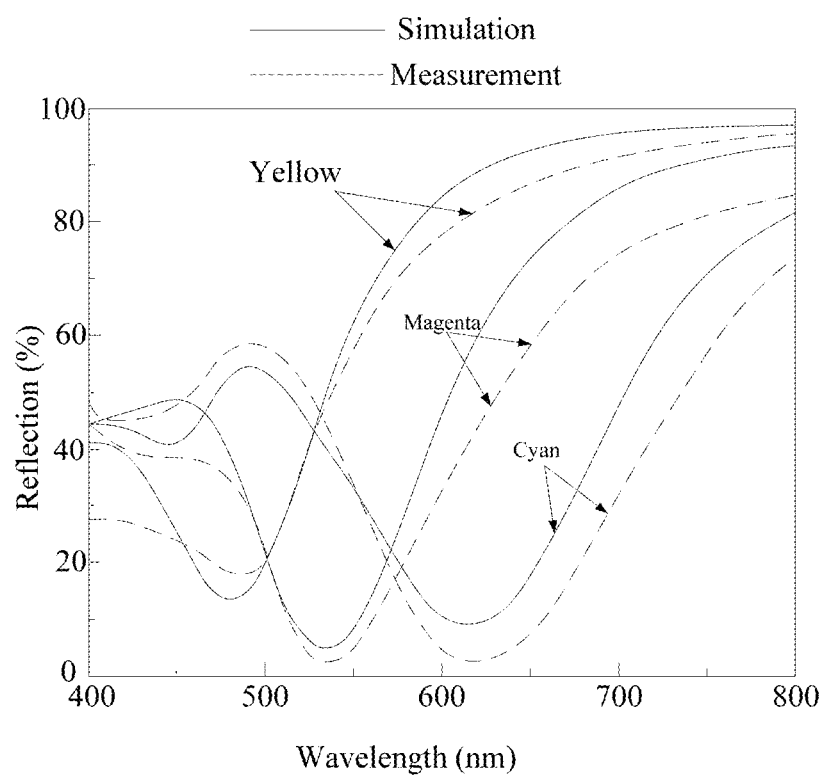
FIG. 5B shows curves demonstrating measured and calculated reflection spectra of cyan magenta yellow in a structural color device
Figure 6B:
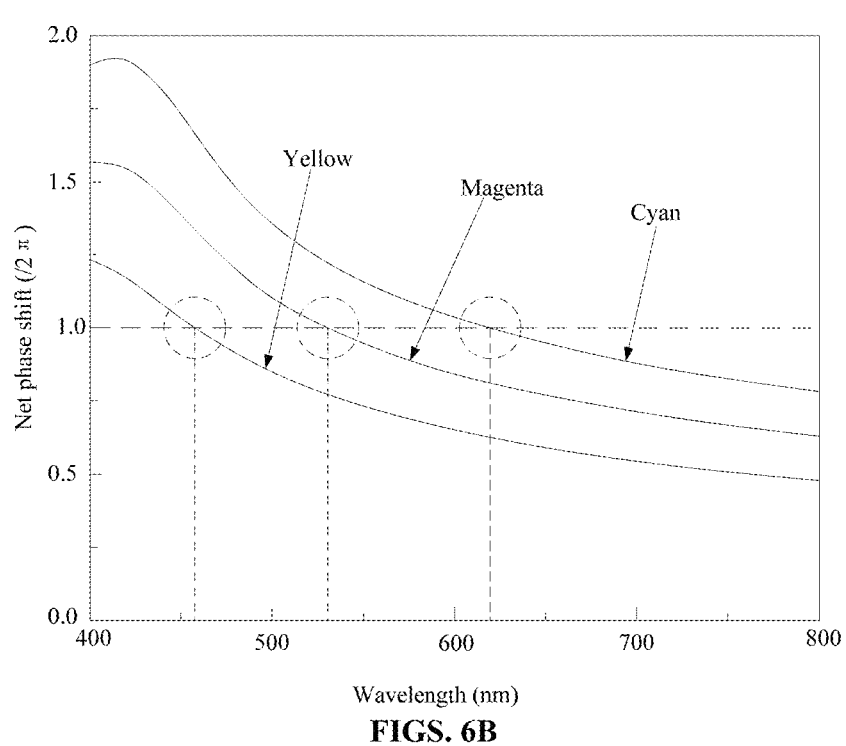
FIG. 6B shows curves demonstrating a net phase shift of cyan magenta yellow colored device according to an embodiment of the present disclosure.

FIG. 6B provides the net phase shift, which includes two reflection phases at both the top and bottom interfaces and the accumulated propagation phase, within the Cu$_2$O layer for the three CMY colored devices based on the measured refractive indices. This figure clearly indicates the absorption resonances (at 458 nm for yellow, at 531 nm for magenta, and at 618 nm for cyan where the net phase shift is equal to a multiple of $2\pi$), light in the visible range may be selectively absorbed for the reflective color generation, which explains the reflection dips seen in FIG. 5B.

Although electrodeposition may result in conformal coatings irrespective of the roughness of the substrates, these films may generally have a larger surface roughness than those deposited via vacuum systems, unless appropriate care is taken. Because all three layers may be electrodeposited in the present disclosure, the surface roughness may gradually increase as each layer is sequentially electrodeposited. Here, epitaxial growth of ultra-smooth Au on Si (111) may be arranged to reduce the roughness of the subsequent dielectric and metal. In such a way, a roughness of the overall device may be reduced. Epitaxial growth of Au on H-terminated Si may be first demonstrated by Allongue and co-workers (Prod'homme, P. et al, "Electrochemical growth of ultraflat Au(111) epitaxial buffer layers on H—Si(111)," *Appl. Phys. Lett.*, 93, p. 171901 (2008), the relevant portions of which are incorporated herein by reference), and an interface model using coincident site lattices may be applied to explain the epitaxial growth of Au on Si even though this system has a–24.9% mismatch of lattice parameters.

According to the present disclosure, it may be shown that the Au film deposited on Si (111) may be smoother than that deposited on Si (100) and Si (110). In addition to a Si (111) orientation, the Si substrate with a small miscut angle may be utilized, and a staircase structure due to the miscut may result in additional nucleation sites for Au growth.

An electrolyte in the form of an aqueous solution containing 0.1 mM HAuCl$_4$.3H$_2$O, 1 mM KCl, 1 mM H$_2$SO$_4$ and 100 mM K$_2$SO$_4$ may be used for the electrodeposition of the bottom Au layer. The electrodeposition may be performed at a potential of E=–1.9 V vs. Ag/AgCl, as such the potential may allow the epitaxial Au thin-film in high quality to be formed on the H-terminated Si (111) substrate due to an enhanced hydrogen evolution reaction (HER) through the following reactions:

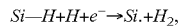

$$Si\text{—}H + H^+ + e^- \rightarrow Si\text{.} + H_2, \quad (1)$$

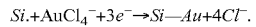

$$Si\text{.} + AuCl_4^- + 3e^- \rightarrow Si\text{—}Au + 4Cl^-. \quad (2)$$

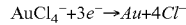

$$AuCl_4^- + 3e^- \rightarrow Au + 4Cl^- \quad (3)$$

Figure 7A:
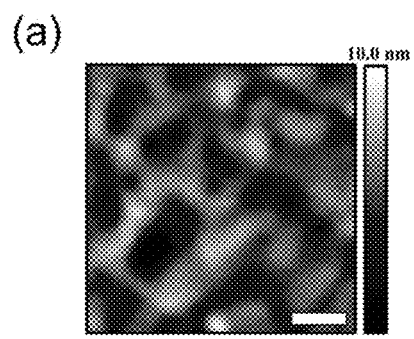
FIG. 7A shows atomic force microscopy measurements of a bottom of an electrodeposited gold layer according to an embodiment of the present disclosure.

The Au electrodeposition rate employed in one embodiment may be about 1 nm/min, and may further be increased by increasing the concentration of the precursor species in solution while adjusting the pH. FIG. 7A shows the atomic force microscopy (AFM) measurement of the electrodeposited Au thin-film (40 nm thick) on the n+Si (111) substrate. According to the measurement, a root-mean-square (RMS) roughness may be only about 1.4 nm with an arithmetic average roughness ($R_a$) of approximately 1.1 nm, indicating that the electrodeposited Au thin-film may be ultra-smooth.

A dielectric layer of Cu$_2$O may subsequently be electrodeposited on the bottom Au layer using an alkaline Cu(II)-citrate solution. By controlling the cathodic current density, the Cu$_2$O (j=0.1 mA/cm$^2$) and Cu (j=1 mA/cm$^2$) films may be deposited using the alkaline Cu(II)-citrate solution through the following reactions:

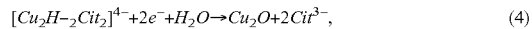

$$[Cu_2H_{-2}Cit_2]^{4-} + 2e^- + H_2O \rightarrow Cu_2O + 2Cit^{3-}, \quad (4)$$

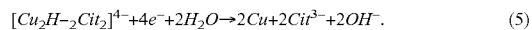

$$[Cu_2H_{-2}Cit_2]^{4-} + 4e^- + 2H_2O \rightarrow 2Cu + 2Cit^{3-} + 2OH^-. \quad (5)$$

Figure 10:
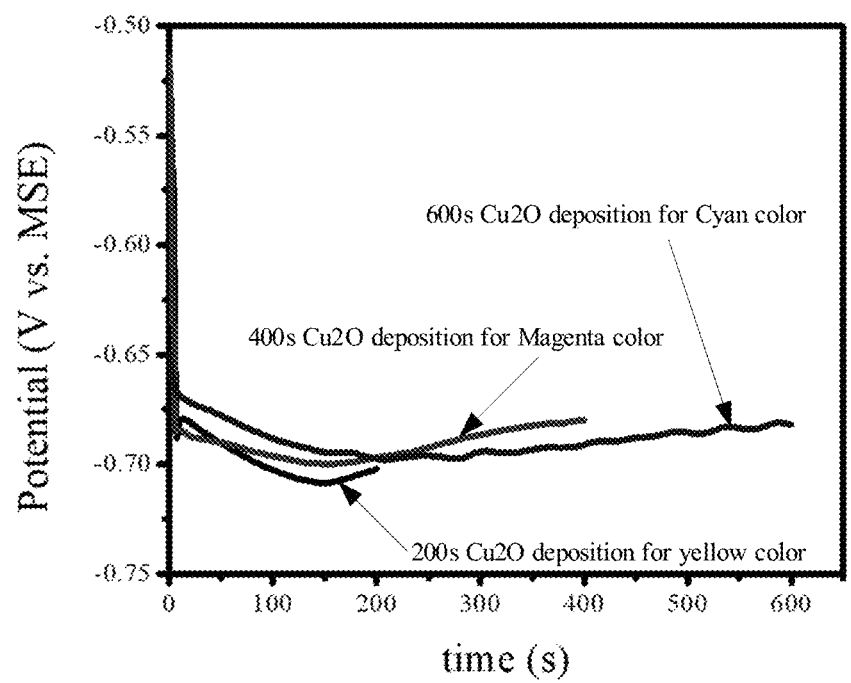
FIG. 10 shows chronopotentiometry plots of cuprous oxide ($Cu_2O$) thin-films electrodeposited on $Au/n^+$ Si (111) electrodes according to an embodiment of the present disclosure.

Thus, according to the present disclosure, a process of fabricating the electrodeposited structural color device may further be simplified by replacing the Au layers in the device with Cu, by arranging the asymmetric Cu/Cu$_2$O/Cu MDM stack using a single solution, and by simply pulsing the cathodic current density supplied. When using the alkaline solution containing 0.4 M CuSO$_4$.5H$_2$O and 1.6 M citric acid for the electrodeposition operation, the electrodeposition may be performed at T=50° C. and pH=10.9, such that an electrodeposition rate of Cu may be at approximately 1 nm/s, and a electrodeposition rate of Cu$_2$O may be at approximately 0.05-0.1 nm/s. However, that the electrodeposited Cu thin-film obtained by using the alkaline solution containing 0.4 M CuSO$_4$.5H$_2$O and 1.6 M citric acid may be optically lossy and the conductivity is two orders lower than that of evaporated Cu, even though a pure Cu signal may be detected in the energy dispersive spectroscopy (EDS) and X-ray diffraction (XRD) spectra of these thin-films. Annealing the Cu thin-film in argon (Ar) gas at T=200° C. may increase the surface roughness of Cu thin-film, possibly due to diffusion of impurities from a bulk of the thin-film to the surface. While not limiting to any particular theory, it may be hypothesized that the relatively fast deposition rate of Cu (about 1 nm/s) might result in nanoscale voids in the Cu film (that are filled with impurities from the solution) that render it optically lossy. Comproportionation and precipitation of Cu$_2$O during and following Cu electrodeposition may also play a role. Thus, the Cu film electrodeposited by using the alkaline solution containing 0.4 M CuSO$_4$.5H$_2$O and 1.6 M citric acid may not be used in the optical device in the present disclosure. The Cu$_2$O thin-film of variable thicknesses for the CMY colored device in the present disclosure may be deposited by altering duration of the electrodeposition operation, and all other parameters may remain unchanged. FIG. 10 shows chronopotentiometry plots for three different thicknesses of the electrodeposited Cu$_2$O thin-film, which may exhibit yellow color (for 200 seconds of Cu$_2$O deposition), magenta color (for 400 seconds of Cu$_2$O deposition), and cyan color (for 600 seconds of Cu$_2$O deposition).

Figure 7B:
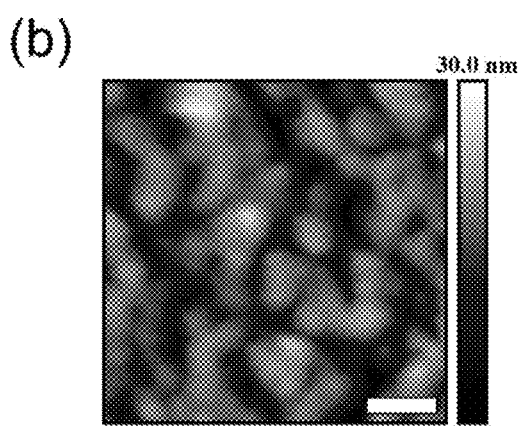
FIG. 7B shows atomic force microscopy measurements of a cuprous oxide/gold electrodeposited stack according to an embodiment of the present disclosure.

AFM measurement of the Cu$_2$O thin-film on the electrodeposited Au film obtained from FIG. 7A is shown in FIG. 7B. As expected, the RMS roughness (approximately 45 nm $Cu_2O$ for the magenta color is used as an example) may increase to about 4.2 nm with surface roughness $R_a$ of approximately 3.3 nm, but nonetheless these films are still smooth and possess a mirror-like appearance.

Electrodeposition of the top metal layer of the tri-layer MDM stack may pose challenges due to the structural color device requiring an ultra-thin (e.g., less than about 20 nm) and ultra-smooth top metal layer and requiring the underlying $Cu_2O$ layer not to be interrupted during performing the electrodeposition operation to form the top metal layer. The electrodeposition solution used for forming the bottom Au film may not be appropriate since the $Cu_2O$ film may be etched in the acidic (pH of about 3) solution. The pourbaix diagram for the Cu—O—H system indicates $Cu_2O$ may be stable in alkaline conditions at relatively low applied bias. Therefore, an alkaline solution (pH of approximately 10-11) containing the Au-precursor species may be used for electrodepositing the top Au layer.

Figure 7C:
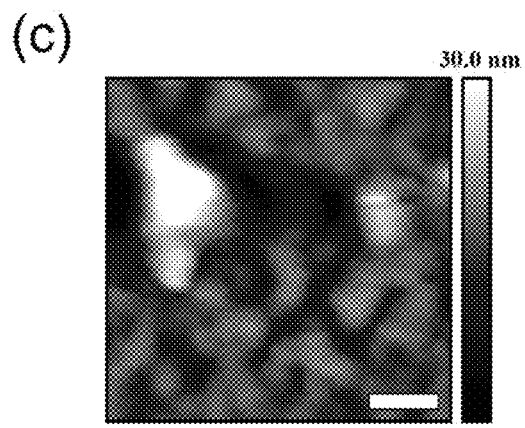
FIG. 7C shows atomic force microscopy measurements of a final gold/cuprous oxide/gold stack structure according to an embodiment of the present disclosure.
Figure 7D:
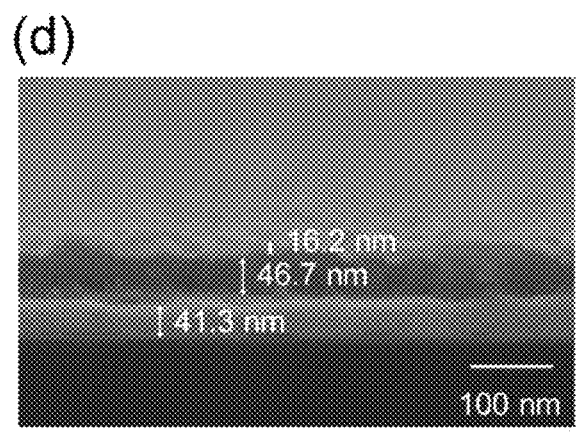
FIG. 7D is a SEM image of a cross section of a magenta colored device according to an embodiment of the present disclosure.

A voltammetric response of the n+Si (111) substrate in the alkaline solution performed at T=35° C. may indicate Au electrodeposition proceeds within a wide potential range of approximately $-2.5<E<-1.1$ V vs. mercury sulfate electrode (MSE) ($-2.06<E<-0.66$ V vs. Ag/AgCl), and the electrodeposition operation performed at more negative potentials may result in a smoother film being formed due to enhanced HER. However, the electrodeposition operation performed at E=−2 V vs. MSE (E=−1.56 V vs. Ag/AgCl) on the $Cu_2O$/Au MD stack may result in the bi-layer stack being peeled off due to $H_2$ bubble formation. Thus, the top Au layer (approximately 15 nm thick) may be electrodeposited at E=−1.1 V vs. MSE (E=−0.66 V vs. Ag/AgCl) and T=50° C. with a constant stirring of 200 rpm. Performing the electrodeposition operation at less negative potentials may protect the underlying $Cu_2O$ layer, and that is, $Cu_2O$ of the underlying layer may not be reduced to Cu. AFM of the final MDM structure after the top metal electrodeposition being formed is provided in FIG. 7D. The electrodeposition of top metal layer may not significantly increase the overall roughness of the tri-layer stack (RMS roughness about 5.3 nm with $R_a$ of about 3.5 nm), although there are dispersedly spaced domains of increased 3D Au growth which is a direct consequence of suppressing HER during the Au electrodeposition. These 3D domains appear as approximately 100 nm wide particles with a thickness of 30 nm in the AFM of the final MDM stack (FIG. 7C). Using the magenta colored device as an example, the cross-section scanning electron microscope (SEM) image shown in FIG. 7D verifies the thickness of each layer, which is very close to the design described earlier. Both the small degree of thickness variation during electrodeposition and the surface roughness of electrodeposited films lead to the slight discrepancy between the measured and simulated reflection spectra as seen in FIG. 5B.

Figure 8A:
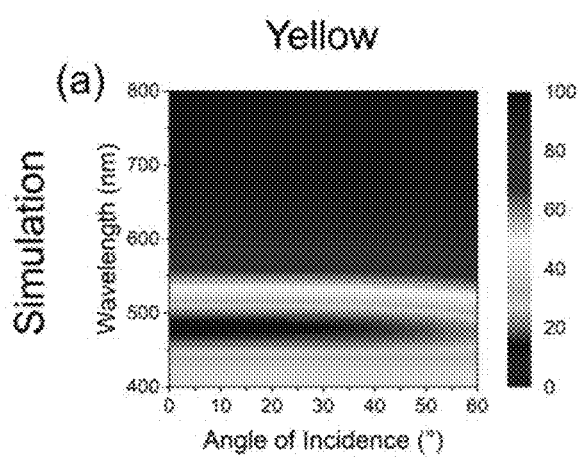
FIG. 8A shows simulated angle-resolved reflection spectra of yellow in a cyan magenta yellow structural colored device according to an embodiment of the present disclosure.
Figure 8B:
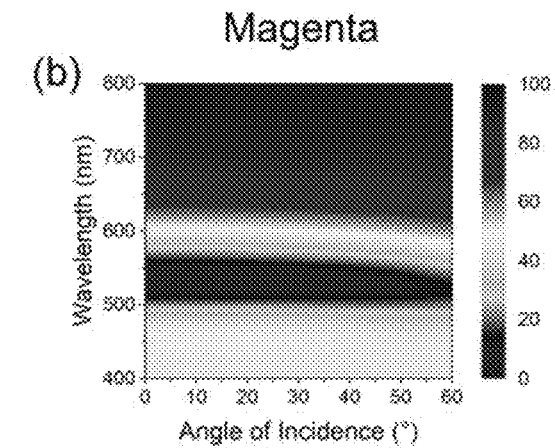
FIG. 8B shows simulated angle-resolved reflection spectra of yellow in magenta cyan magenta yellow structural colored device according to an embodiment of the present disclosure.
Figure 8C:
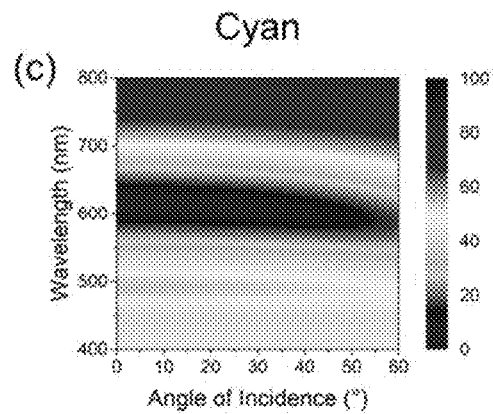
FIG. 8C shows simulated angle-resolved reflection spectra of cyan in magenta cyan magenta yellow structural colored device according to an embodiment of the present disclosure.
Figure 8D:
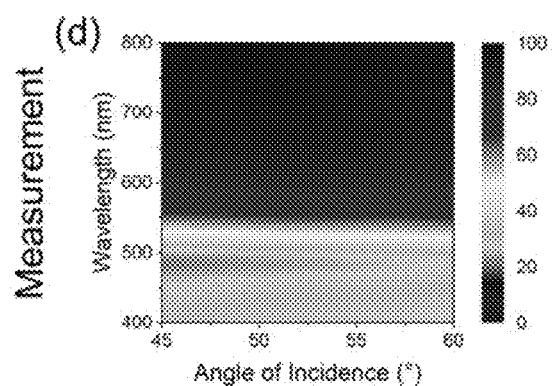
FIG. 8D shows measured angle-resolved reflection spectra of yellow in the cyan magenta yellow structural colored device according to the embodiments shown in FIG. 8A.
Figure 8E:
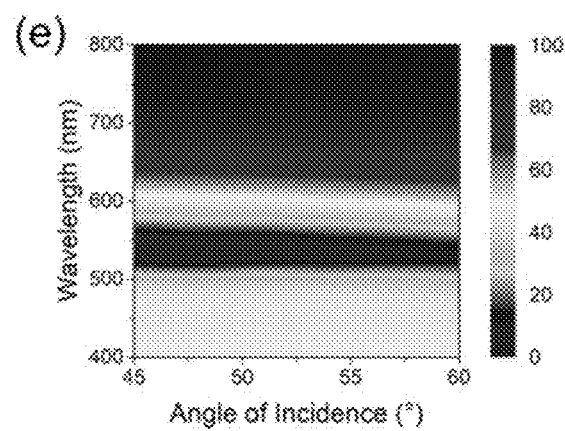
FIG. 8E shows measured angle-resolved reflection spectra of magenta in the cyan magenta yellow structural colored device according to the embodiments shown in FIG. 8B.
Figure 8F:
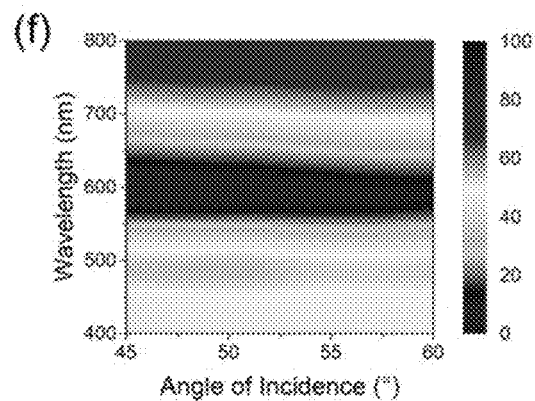
FIG. 8F shows measured angle-resolved reflection spectra of cyan in the cyan magenta yellow structural colored device according to the embodiments shown in FIG. 8C.
Figure 8G:
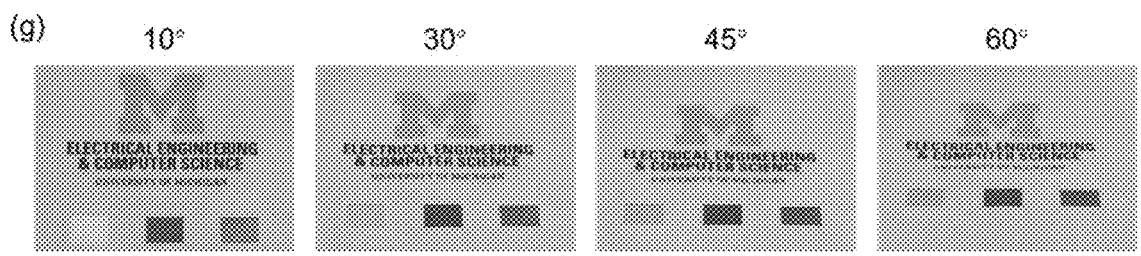
FIG. 8G shows photographs of fabricated CMY samples taken at various observation angles according to an embodiment of the present disclosure.

FIGS. 8A-8C present the measured angle-resolved reflection spectra under unpolarized light, which are in great agreement with the calculated results displayed in FIGS. 8D-8F. It is evident that the reflection valleys are almost invariant with respect to the incident angle up to ±60°. This salient angle-insensitive characteristic is due to the high refractive index of the $Cu_2O$ cavity material, which leads to a very small refracted angle into the structure. In FIG. 8G, photographs of the fabricated CMY samples taken at various angles under ambient light clearly validate the highly-valuable angle-robust performance of these devices.

In contrast, structural colors based on ordered nanoparticles typically exhibit iridescent appearance due to the low refractive index of the constituent materials (e.g., silicon dioxide ($SiO_2$) nanoparticles), which significantly limits their applications in optical decorations.

Figure 9A:
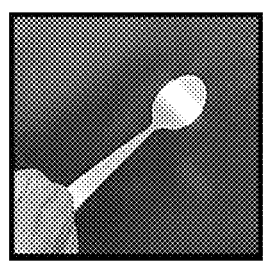
FIG. 9A shows a stainless steel spoon without color coating according to an embodiment of the present disclosure.
Figure 9B:
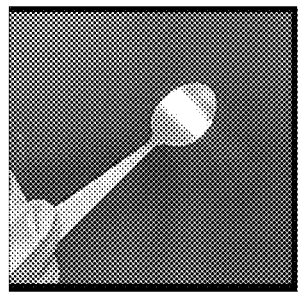
FIG. 9B shows the stainless steel spoon shown in FIG. 9A coated by a structural color yellow.
Figure 9C:
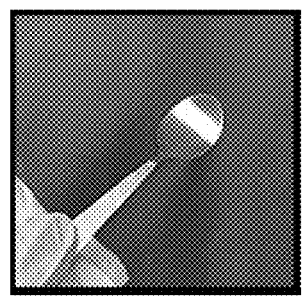
FIG. 9C shows the stainless steel spoon shown in FIG. 9A coated by a structural color magenta.
Figure 9D:
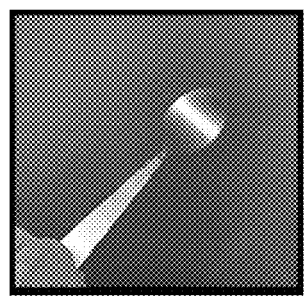
FIG. 9D shows the stainless steel spoon shown in FIG. 9A coated by a structural color cyan.

Due to the conformal deposition nature of the electrodeposited thin-films, the approach to fabricate MDM structural colors is not limited to only flat and smooth films, but can also be extended to directly decorate curved objects having a rough surface. As a demonstration, the CMY structural colors based on the MDM configuration are electrodeposited on stainless-steel spoons. FIGS. 9A-9D show glossy and uniform appearance of the CMY colors on the curved and rough surfaces of these spoons, which is much brighter than traditional dye-based pigments. FIG. 9A shows an uncoated stainless steel spoon, FIG. 9B shows a coating displaying yellow, FIG. 9C shows a coating displaying magenta, and FIG. 9D shows a coating displaying cyan. It should be noted that, by employing suitable electrodeposition conditions, Au in the MDM structural color design can be replaced by other lower cost metals of low optical absorption such as copper (Cu), aluminum (Al) and silver (Ag), without affecting the high reflection brightness, and semiconductors or conductive dielectrics of high refractive index such as amorphous silicon (a-Si), titanium oxide (TiOx) and zinc oxide (ZnO) can also be used as the cavity layer to achieve angle-insensitive colors.

In summary, the present disclosure contemplates anew facile method for structural color generation at ambient conditions employing an electrodeposition process. In certain aspects, the structural color filter design is based on an asymmetric MDM F-P resonator. The thickness of the sandwiched dielectric layer is preselected and tuned for generating various colors. Due to the high refractive index of the cavity layer, the CMY colored devices exhibit stable angle-insensitivity up to 60°, which is a highly desirable quality for many applications. In addition, the techniques are scalable to surfaces of any size, shape and roughness owing to the conformal coating characteristic of electrodeposition. Furthermore, the methods of the present disclosure remove the need for any expensive ancillary equipment, including vacuum deposition systems for structural color generation. Therefore, the fabrication cost for large-scale production of these devices is greatly reduced, opening up a variety of new applications for these structural color devices.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of forming a structural color filter comprising:
   depositing a first metal layer on a surface of a substrate by applying an electric potential to the substrate, wherein the surface of the substrate is in contact with a first electrolyte; the first electrolyte comprises a first precursor, an electrochemical reaction of the first precursor at the surface of the substrate is driven by the electric potential; the depositing the first metal layer on the surface of the substrate is performed at a temperature of less than or equal to 50° C.; and depositing a first dielectric layer on the first metal layer by contacting the first metal layer with a second electrolyte, wherein the second electrolyte comprises a second precursor of a first dielectric material of the first dielectric layer, and the first metal layer is sandwiched between the first dielectric layer and the substrate; and depositing a second metal layer on the first dielectric layer, wherein the first dielectric layer is sandwiched between the first metal layer and the second metal layer;

wherein the first electrolyte has a pH of less than or equal to 3.

2. The method of claim 1, further comprising:

depositing a second dielectric layer on the second metal layer, wherein the second metal layer is sandwiched between the first dielectric layer and the second dielectric layer.

3. The method of claim 1, wherein the first metal layer comprises a metal selected from the group consisting of: gold (Au), copper (Cu), aluminum (Al), silver (Ag), and combinations thereof.

4. The method of claim 1, wherein each of the depositing the first metal layer on the surface of the substrate, the depositing the first dielectric layer on the first metal layer, and the depositing the second metal layer on the first dielectric layer is performed in an environment having an ambient pressure.

5. The method of claim 1, wherein the depositing the second metal layer on the first dielectric layer comprises contacting the first dielectric layer with a third electrolyte, wherein the third electrolyte comprises a third precursor, and the third electrolyte is basic having a pH of greater than or equal to 10.

6. The method of claim 1, wherein the depositing the second metal layer on the first dielectric layer comprises depositing the second metal layer by an electroless deposition process.

7. The method of claim 6, wherein the second metal layer comprises silver and the electroless deposition process comprises exposing a surface of the first dielectric layer to a silver precursor solution and a silver activator solution, exposing the surface of the first dielectric layer to a sensitizing solution, and exposing the surface of the first dielectric layer to a reducer solution.

8. The method of claim 1, further comprising:

forming a second dielectric layer on the second metal layer, and forming a third metal layer on the second dielectric layer, wherein the first metal layer and the third metal layer have a same first thickness, the second metal layer, the first dielectric layer, and the second dielectric layer have a same second thickness, and the first thickness and the second thickness are different.

9. The method of claim 8, further comprising:

forming a third dielectric layer adjacent to the first metal layer, wherein the third dielectric layer has a first exposed surface; and forming a fourth dielectric layer adjacent to the third metal layer, wherein the fourth dielectric layer has a second exposed surface, wherein the third dielectric layer and the first dielectric layer are formed on two opposing sides of the first metal layer, and the fourth dielectric layer and the second dielectric layer are formed on two opposing sides of the third metal layer.

10. The method of claim 8, wherein the first metal layer, the first dielectric layer, the second metal layer, the second dielectric layer, and the third metal layer forms a stack, and the method further comprises separating the stack from the substrate and grinding the stack into particles.

11. The method of claim 1, wherein the first precursor comprises a metal selected from the group consisting of: gold (Au), copper (Cu), aluminum (Al), silver (Ag), and combinations thereof, and the first precursor is selected from the group consisting of: chloroauric acid, potassium dicyanoaurate, copper-citrate, copper tartrate, copper glycerol, silver cyanide, aluminum chloride, silver nitrate, silver diammine complex, and combinations thereof.

12. The method of claim 1, wherein a material of the first dielectric layer is selected from the group consisting of: cuprous oxide ($Cu_2O$), amorphous silicon (a-Si), titanium oxide ($TiO_x$), zinc oxide (ZnO), and combinations thereof, and the second precursor is selected from the group consisting of: copper sulfate, trichlorosilane, zinc nitrate, and titanium powder.

13. The method of claim 1, wherein the depositing the first metal layer comprises applying a current at a current density of greater than or equal to 0.05 $mA/cm^2$ and less than or equal to 1 $mA/cm^2$.

14. The method of claim 1, wherein the depositing the first dielectric layer comprises applying a current at a current density of greater than or equal to 0.05 $mA/cm^2$ and less than or equal to 0.1 $mA/cm^2$.

15. The method of claim 1, wherein the depositing the first dielectric material layer and the depositing of the first metal layer are performed in a three-electrode cell comprising a reference electrode, and the method further comprises monitoring one or more parameters selected from the group consisting of: nucleation of material, material thickness, and rate of deposition of material, via the reference electrode.

16. The method of claim 1, wherein the first metal layer has a surface roughness of less than or equal to 25% of a thickness of the first metal layer.

17. The method of claim 1, wherein the substrate is an electrically conductive substrate, and the electrically conductive substrate is transparent to visible light and is flexible or rigid.

18. The method of claim 1, wherein the first metal layer has a first thickness of greater than or equal to 5 nm and less than or equal to 50 nm, the second metal layer has a second thickness of greater than or equal to 5 nm and less than or equal to 50 nm, and the second thickness is greater than or equal to the first thickness.

19. A method of forming a structural color filter comprising:

depositing a first metal layer on a surface of a substrate in contact with a first electrolyte by applying an electric potential to the substrate, wherein the first electrolyte comprises a first precursor and has a pH of less than or equal to 3, the electric potential drives an electrochemical reaction of the first precursor at the surface of the substrate, the depositing the first metal layer on the surface of the substrate is performed at a temperature of less than or equal to 50° C., and the first metal layer film comprises a metal selected from the group consisting of: gold (Au), copper (Cu), aluminum (Al), silver (Ag), and combinations thereof;

depositing a dielectric layer on the first metal layer by contacting the first metal layer with a second electrolyte, wherein the second electrolyte comprises a second precursor of a dielectric material of the dielectric layer and has a pH of greater than or equal to 10; and depositing a second metal layer on the dielectric layer by contacting the dielectric layer with a third electrolyte and applying an electric potential to the substrate, wherein the third electrolyte comprises a third precursor and has a pH of greater than or equal to 10, the electric potential drives an electrochemical reaction of the third precursor at a surface of the dielectric layer, the depositing the second metal layer on the dielectric layer is performed at a temperature of less than or equal to 50° C., and the second metal layer comprises a metal selected from the group consisting of: gold (Au), copper (Cu), aluminum (Al), silver (Ag), and combinations thereof.

20. A method of forming a structural color filter comprising:
- depositing a first metal layer on a surface of a substrate by a first electrodeposition process, wherein the first electrodeposition process is performed at a temperature of less than or equal to 50° C.; and
- depositing a first dielectric layer on the first metal layer by a second electrodeposition process, wherein the first metal layer is sandwiched between the first dielectric layer and the substrate; and
- depositing a second metal layer on the first dielectric layer, wherein the first dielectric layer is sandwiched between the first metal layer and the second metal layer;
- wherein the depositing the first dielectric material layer and the depositing of the first metal layer are performed in a three-electrode cell.

\* \* \* \* \*